US005623119A

United States Patent [19]
Yater et al.

[11] Patent Number: 5,623,119
[45] Date of Patent: Apr. 22, 1997

[54] REVERSIBLE THERMOELECTRIC CONVERTER

[76] Inventors: Joseph C. Yater, 71 Autumn La., Lincoln, Mass. 01773; Jane A. Yater, 2H Sutton Dr., Matawan, N.J. 07747; Joan E. Yater, 7205 Hart La. #3018, Austin, Tex. 78731

[21] Appl. No.: 429,716

[22] Filed: Apr. 27, 1995

Related U.S. Application Data

[62] Division of Ser. No. 269,654, Jun. 30, 1994, Pat. No. 5,470,395, which is a division of Ser. No. 860,677, Mar. 30, 1992, Pat. No. 5,356,484.

[51] Int. Cl.$^6$ ................................................. H01L 37/00
[52] U.S. Cl. .................... 136/225; 136/203; 136/204; 136/205; 136/242
[58] Field of Search .................... 136/200, 205, 136/206, 211, 212, 224, 225, 241, 242, 203, 204; 310/306, 307; 322/2 R

[56] References Cited

U.S. PATENT DOCUMENTS

| | | | |
|---|---|---|---|
| 3,116,427 | 12/1963 | Giaever | 307/88.5 |
| 3,126,509 | 3/1964 | Pulvari | 323/74 |
| 3,243,687 | 3/1966 | Hoh | 322/2 |
| 3,259,759 | 7/1966 | Giaever | 307/88.5 |
| 3,272,986 | 9/1966 | Schmidt | 250/86 |
| 3,356,864 | 12/1967 | Giaever | 307/88.5 |
| 3,419,767 | 12/1968 | Dahlberg | 317/235 |
| 3,460,008 | 8/1969 | Dahlberg | 317/235 |
| 3,495,141 | 2/1970 | Dahlberg | 317/235 |
| 3,601,632 | 8/1971 | Frazier | 307/219 |
| 3,631,306 | 12/1971 | Hitchcock | 317/234 |
| 3,751,687 | 8/1973 | Jutzi | 307/279 |
| 3,890,161 | 6/1975 | Brown, III | 136/212 |
| 3,920,413 | 11/1975 | Lowery | 29/197 |
| 4,004,210 | 1/1977 | Yater | 322/2 R |
| 4,019,113 | 4/1977 | Hartman | 321/1.5 |
| 4,106,952 | 8/1978 | Kravitz | 136/89 HY |
| 4,231,149 | 11/1980 | Chapman et al. | 29/578 |
| 4,631,350 | 12/1986 | Germanton et al. | 136/225 |
| 4,663,115 | 5/1987 | Russell | 376/320 |
| 4,710,588 | 12/1987 | Ellion | 136/206 |
| 4,717,786 | 1/1988 | Thery et al. | 136/212 |
| 4,795,498 | 1/1989 | Germanton et al. | 136/225 |

OTHER PUBLICATIONS

E.A. DeMeo et al, Proc. of the 21st Inst. of Elect. & Electronics Engineers Photovoltaic Specialists Conference, 1990, Kissimmee, May 21–25, 1990 (Inst. of Elect. & Electronics Eng.), New York, 1990, pp. 16–23.

J.C. Yater, Physical Review A, vol. 20, No. 2, Aug. 1979, pp. 623–627.

J.C. Yater, Solar Cells, vol. 10, Aug. 1983, pp. 237–255.

R.C. Jaklevic et al, Physical Review B, vol. 12, No. 10, Nov. 15, 1975, pp. 4146–4160.

F. Capasso et al, Quantum Electron Devices, Physics Today, Feb. 1990, pp. 74–82.

(List continued on next page.)

Primary Examiner—Charles T. Jordan
Assistant Examiner—Chrisman D. Carroll
Attorney, Agent, or Firm—Wolf, Greenfield & Sacks, P.C.

[57] ABSTRACT

A reversible thermoelectric converter includes first and second quantum well diodes and an electrical connection between the first and second quantum well diodes without a thermal barrier between them. Each quantum well diode includes first and second electrodes wherein electrons are quantized in discrete energy levels and a dielectric layer providing a potential barrier between the first and second electrodes. When electrons in the first quantum well diode have a higher temperature than the electrons in the second quantum well diode, electric voltage fluctuations resulting from transitions of the electrons between the energy levels in the first quantum well diode are coupled from the first quantum well diode to the second quantum well diode. The reversible thermoelectric converter can be operated for power conversion of thermal energy to electric energy, as a heat pump or a refrigerator, or as an amplifier. A planar array of reversible thermoelectric converter elements provides a desired output voltage and current.

21 Claims, 12 Drawing Sheets

OTHER PUBLICATIONS

R. Eisberg & R. Resnick, Quant. Phys. of Atoms, Molecules, Solids, Nuclei & Part., J. Wiley & Sons, Inc., New York 1974, pp. 442–444.

W. Band, An Introduction To Quantum Statistics, D. Van Nostrand Co., Inc., New York, 1955, pp. 38–40.

J.C. Yater, Applied Optics, Feb. 1975, pp. 526–536.

R. Dingle, "Confined Carrier Quantum States in Ultrathin Semi–Conductor Heterostructurees", Festkorperprobleme XV, 1975, pp. 21–26.

H. Nanto et al, "Electrical & Optical Prop. of Indium Tin Oxide Thin Films . . . ", J. Appl. Phys. vol. 63, No. 8, 15 Apr. 1988, pp. 2711–2716.

J.C. Yater, "Power Conversion of Energy Fluctuations", Physical Rev. A, vol. 10, No. 4, Oct. 1974, pp. 1361–1369.

J.C. Yater, "Relation of the Second Law of Thermodynamics . . . ", Physical Review A, vol. 20, No. 4, Oct. 1979, pp. 1614–1618.

J.C. Yater, "Particle Interactions in the Power Conversion of Energy Fluctuations", Physical Review A, vol. 26, No. 2, Nov. 1982, pp. 2954–2967.

J.C. Yater, "Solar Reversible Energy Fluctuation Converter", SPIE Proceedings, vol. 407, Apr. 1983.

"Converting Solar Energy Into Electricity: A Major Breakthrough?" House of Representatives, Jun. 11, 1976.

REVERSIBLE THERMOELECTRIC CONVERTER

This application is a division of application Ser. No. 08/269,654 filed Jun. 30, 1994, now U.S. Pat. No. 5,470,395, which is a division of application Ser. No. 07/860,677 filed Mar. 30, 1992, U.S. Pat. No. 5,356,484.

FIELD OF THE INVENTION

This invention relates to reversible thermoelectric power conversion devices, and more particularly, to reversible thermoelectric converters which utilize quantum well diodes. More specifically, the invention relates to devices for converting the thermal energy of hot electrons to electric energy and for pumping heat from low temperature regions to high temperature regions, and to applications of such devices.

BACKGROUND OF THE INVENTION

Devices for converting thermal directly to electric energy have been extensively investigated. The most commonly utilized devices have been thermionic converters working from high temperature sources and silicon cells utilizing the input thermal energy of solar radiation. Such devices have limited operating temperature ranges. In addition, the efficiencies for the direct conversion of solar energy to electricity that are required to be competitive with conventionally generated electricity in many U.S. markets over the next few decades have not yet been achieved. These required efficiencies range from the lowest efficiency requirement of 10% module efficiency for flat plate modules to the highest efficiency requirement of 25% module efficiency for concentrated solar energy. These required efficiencies are reported by E. A. DeMeo et al in Proceedings of the 21st Institute of Electrical and Electronics Engineers Photovoltaic Specialists Conference—1990, Kissimmee, May 21–25, 1990 (Institute of Electrical and Electronics Engineers, New York, 1990), pp. 16–23.

A reversible thermoelectric converter having a high operating efficiency is disclosed in U.S. Pat. No. 4,004,210 issued Jan. 18, 1977 to Yater. The disclosed device comprises a first layer of microcircuit modules for converting thermal energy into electric voltage fluctuations, a second layer of microcircuit modules for receiving the electric voltage fluctuations and a third layer between the first and second layers. The third layer is a thermal barrier, such as a vacuum. Electric voltage fluctuations are capacitively coupled from the first layer across the thermal barrier to the second layers. The first and second layers operate at different temperatures. The microcircuit modules can be Schottky barrier diodes or quantum or tunnel diodes. The reversible thermoelectric converter disclosed in U.S. Pat. No. 4,004,210 has the potential to achieve efficiencies as high as 90%. The thermal barrier transmits electric voltage fluctuations and prevents cooling, radiation losses and lead conduction losses.

The theoretical basis for the operation of reversible thermoelectric converters is described by J. C. Yater in *Physical Review A*, August 1979, pages 623–627, J. C. Yater in *Physical Review A*, July 1982, pages 522–538 and by J. C. Yater in *Solar Cells*, Vol. 10, August 1983, pages 237–255. These articles describe efficiencies up to 99% of the Carnot cycle efficiency and describe physically realizable diode designs, including thin film, quantum effect and thermionic, that can enable high power output and high efficiency to be achieved. All of the previously disclosed reversible thermoelectric converters known to applicants include a separate thermal barrier between the hot and cold layers of the circuit.

Quantum size effects in thin metal films is described by R. C. Jaklevic et al in *Physical Review B*, Vol. 12, No. 10, Nov. 15, 1975, pages 4146–4160. Devices involving quantum effects are described by F. Capasso et al in "Quantum Electron Devices", *Physics Today*, February 1990, pages 74–82. A typical quantum well diode includes a thin dielectric layer between two thin metal layers. Electrons in the metal layers are quantized into discrete energy levels in a direction perpendicular to the metal surface. The dielectric layer forms a potential barrier.

It is a general object of the present invention to provide improved reversible thermoelectric converters.

It is another object of the present invention to provide an improved reversible thermoelectric converter including a thin film quantum well diode for directly converting thermal energy of hot electrons to electric energy.

It is a further object of the present invention to provide reversible thermoelectric converters with improved efficiency of conversion of solar energy to electrical energy.

It is yet another object of the present invention to provide hot electrons for the reversible thermoelectric converter from different heat sources including fossil, nuclear and geothermal heat sources.

It is a further object of the present invention to provide efficient operation of the reversible thermoelectric converter at low temperatures.

SUMMARY OF THE INVENTION

According to the present invention, these and other objects and advantages are achieved in a reversible thermoelectric converter comprising a first device, or element, and a second device, or element. The first and second devices are electrically connected together without a thermal barrier between them. The first and second devices each comprise first and second regions wherein electric carriers are quantized in discrete energy levels, and a third region that provides a potential barrier between the first and second regions. Preferably, the first and second devices each comprise a quantum well diode. Preferably, the first region of each device comprises a first thin metal film, the second region comprises a second thin metal film and the third region comprises a thin dielectric film. The first and second thin metal films are sufficiently thin that the electrons in each metal film are quantized in discrete energy levels.

The apparatus in accordance with the invention is capable of performing several energy conversion functions. In a first energy conversion function, thermal energy is converted into electric energy. Thermal energy, typically in the form of radiation such as solar energy, is applied to the first device, causing the electrons in the first device to be raised to a higher temperature and to higher energy levels. The thermal energy is converted by the first device into electric voltage fluctuations. The electric voltage fluctuations are coupled to the second device wherein the electrons are maintained at a lower temperature. The electric voltage fluctuations are converted by the second device to electric energy which is provided at output terminals.

In a second energy conversion function of the reversible thermoelectric converter of the present invention, thermal energy from an external source is applied to the first device and is converted by the first device into electric voltage fluctuations. The electric voltage fluctuations are coupled to the second device and are converted to thermal energy at a higher temperature than the temperature of the external source. In this mode, the apparatus operates as heat pump or as a refrigerator.

In a third energy conversion function of the reversible thermoelectric converter, cyclically varying energy is applied to the first device and is converted into electric voltage fluctuations. The electrons in the first device have a relatively low temperature. The second device receives thermal energy at a constant level and converts the thermal energy to electric voltage fluctuations. The electrons in the second device have a relatively high temperature. The electric voltage fluctuations are coupled between the first and second devices. The apparatus includes output terminals for providing cyclically varying electric energy having the same waveform and a higher energy level than the cyclically varying energy received by the first device.

According to another aspect of the present invention, a reversible thermoelectric converter array comprises a substrate and one or more reversible thermoelectric converter array elements formed on the substrate. Each array element comprises a first quantum well diode, a second quantum well diode, and means for electrically connecting the first diode to the second diode without a thermal barrier between them. The array preferably includes spaced-apart lower electrodes formed on the substrate, a dielectric film formed on the lower electrodes, and spaced-apart upper electrodes formed on the dielectric film and overlying at least part of the lower electrodes to form a series array of electrodes. The electrodes are preferably thin metal films.

The reversible thermoelectric converter array elements can be connected in series on the substrate to provide a desired output voltage. Multiple arrays can be connected in parallel to provide a desired output current.

The first diode and the second diode of each array element can each comprise a number of electrode pairs connected in series and means for applying successively larger voltage increments to the electrode pairs of the first and second diodes. In one embodiment, the means for applying successively larger voltage increments comprises auxiliary electrodes for applying electric fields to the electrode pairs of the first and second diodes and means for applying voltages to the auxiliary electrodes. In another embodiment, the first diode of an array element is formed on a first substrate portion and the second diode is formed on a second substrate portion such that the first and second diodes can be physically separated during operation.

The array can include a thermal reservoir associated with each of the array elements. The thermal reservoir is advantageous when the array is used in an enclosed environment. The thermal reservoir can comprise spaced-apart metal electrodes disposed in close proximity to the electrodes of the first and second diodes and electrically isolated therefrom.

According to a further aspect of the invention, there is provided a two-stage reversible thermoelectric converter comprising a power conversion stage for receiving thermal energy and converting the thermal energy to electric energy, and a heat pump stage. The power conversion stage includes a first quantum well diode and a second quantum well diode connected as described above. The heat pump stage reduces the temperature of the second quantum well diode in the power conversion stage. The heat pump stage includes a third quantum well diode and a fourth quantum well diode connected as described above, and means for supplying a DC voltage to the heat pump stage sufficient to reverse the contact potential across the quantum well diodes. The heat pump stage reduces the temperature of the electrons in the second quantum well diode of the power conversion stage and thereby increases the efficiency of the power conversion stage.

BRIEF DESCRIPTION OF THE DRAWINGS

For a better understanding of the present invention, together with other and further objects, advantages and capabilities thereof, reference is made to the accompanying drawings which are incorporated herein by reference and in which.

DETAILED DESCRIPTION OF THE INVENTION

The basic reversible thermoelectric converter of the present invention comprises two nonlinear circuit elements with an electrical connection between the two circuit elements. The two circuit elements are typically quantum well diodes operating such that the electric carriers of the two diodes have different temperatures. The physical process of the reversible thermoelectric converter is that of a heat engine using a reversible thermodynamic process to convert thermal energy into electric energy or to convert electric energy into thermal energy or to combine both processes within one reversible thermoelectric converter circuit. The reversible process of the circuit is operated as an ordered succession of equilibrium states.

The classical reversible thermoelectric converter, as disclosed in U.S. Pat. No. 4,004,210, is based on classical thermodynamics and includes a discrete and separate thermal barrier between the hot and cold diodes. The theory of the reversible processes of the classical circuit shows that the incoming energy fluctuations in the form of increments of thermal energy are converted into electromagnetic energy without, in the limit, any irreversible losses occurring, such as heat losses across the thermal barrier. In the limit, the intrinsic efficiency for the classical circuit approaches that of the Carnot cycle efficiency, $E=1-T_c/T_r$, where $T_c$ is the circuit temperature and $T_r$ is the source temperature. For solar energy, the source temperature is the temperature of the sun.

The reversible thermoelectric converter of the present invention uses a quantum reversible thermodynamic cycle. The separate thermal barrier of the classical circuit is replaced with a quantum well potential thermal barrier within the thin film electrodes of a quantum well diode. Input hot electrons to the electrodes of the quantum well diode are the result of input energy fluctuations such as from photogenerated electrons or input hot electrons over a conservative potential barrier. A conservative potential barrier is defined as a potential barrier where the transmission probability for a barrier crossing by a particle is a function of the energy of the particle and where the barrier crossing is reversible and no dissipative energy loss occurs for the particle barrier crossing. In comparison with the classical circuit, the quantum reversible thermoelectric converter of the present invention provides improved performance, reduced cost, simplified manufacturing and expanded applications.

Figure 1:
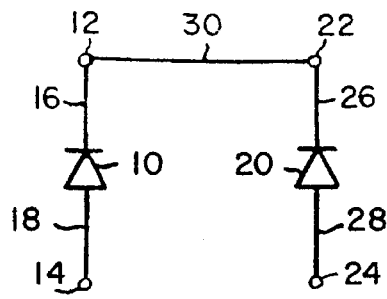
FIG. 1 is a schematic diagram of a reversible thermoelectric converter in accordance with the present invention.

A reversible thermoelectric converter in accordance with the present invention is shown schematically in FIG. 1. A diode 10 is connected to terminals 12 and 14 by conducting leads 16 and 18, respectively. A diode 20 is connected to terminals 22 and 24 by conducting leads 26 and 28, respectively. Terminals 12 and 22 are connected by a conducting lead 30 or by a capacitor (not shown). Diodes 10 and 20 are quantum well diodes as described below. For a typical power conversion process, the incoming thermal energy in the form of hot electrons, such as hot electrons which are photogenerated by incoming solar energy, are applied to the diode 10. When the converter is used in a power conversion process, terminals 14 and 24 are the output terminals of the circuit for supplying electric energy.

Figure 2:
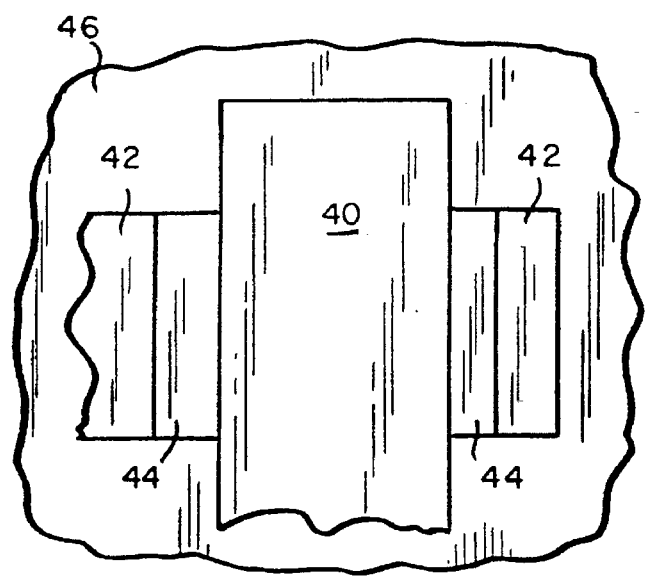
FIG. 2 is a top view of a quantum well diode suitable for use in the reversible thermoelectric converter of FIG. 1.
Figure 3:
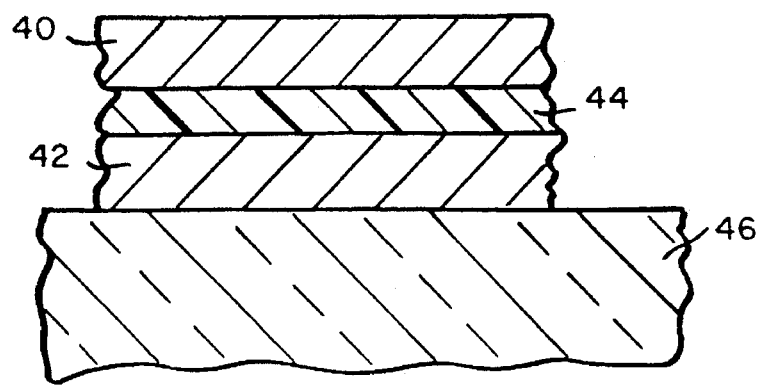
FIG. 3 is a cross section of the quantum well diode of FIG. 2.

A quantum well diode is shown in FIGS. 2 and 3. Conducting films 40 and 42 are separated by a dielectric layer 44 which serves as a diode barrier. The device is typically formed on a glass substrate 46. The layers 40, 42 and 44 have thicknesses in a range of a few angstroms to several hundred angstroms to insure that the electron energy levels are quantized. In a preferred embodiment, layer 42 is an aluminum film, barrier layer 44 is aluminum oxide and layer 40 is a copper film.

The use of state of the art evaporation techniques results in a variation in the thickness of about 10%, or approximately 10 atomic layers, in the aluminum and copper films. However, a thickness variation approaching only one atomic layer is required for effective separation of energy levels in the quantum wells of the diode. The existence of electronic standing wave energy levels in thin metal films resulting from the quantized nature of the crystalline structure of the film has been described in the aforementioned article by R. C. Jaklevic et al. The standing waves reduce the spread that would otherwise occur in the quantized energy levels. These standing wave energy levels, called lattice commensurate states, have a potential for applications in optoelectronics, since these thin metal films have extremely large absorption and emission strengths at appropriate wavelengths.

Figure 4A:
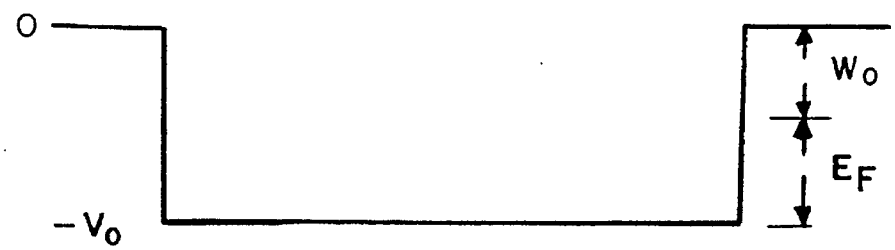
FIG. 4A is an energy level diagram for a metal in vacuum.

The quantum well diodes used in the reversible thermoelectric converter of the present invention include thin film metal quantum wells separated by a thin dielectric tunneling barrier. The average potential of a conduction electron in a bulk metal in vacuum at zero temperature is shown in FIG. 4A. A potential well of depth $V_o$ in the metal rises rapidly near the metal boundaries to zero. As stated by R. Eisberg and R. Resnick in *Quantum Physics of Atoms, Molecules, Solids, Nuclei and Particles*, John Wiley & Sons, Inc., New York 1974, pp. 442–444, the energy levels at energy E in a bulk metal increase in electron density proportional to $E^{1/2}$ and are filled up to the Fermi level $E_F$. The electron work function $W_o$ is the difference between the potential well depth $V_o$ and the Fermi level $E_F$. Thus, $V_o=W_o+E_F$, where $V_o=0$ in the vacuum outside the metal.

Figure 4B:
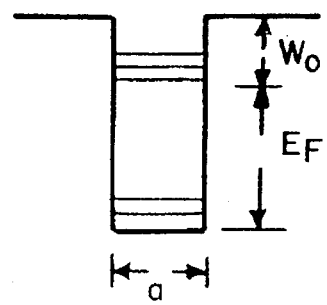
FIG. 4B is an energy level diagram for a thin metal film having quantized energy levels.

When a thin metal film has a thickness in the range of about 100 angstroms, a quantum size effect of the film thickness results from quantized electron motion in a direction perpendicular to the plane of the metal film. The quantum size effect gives rise to a series of discrete bound states in the potential well as shown in FIG. 4B. The energy levels $E_n$ of the bound states are given by $E_n=3.76 \, (n/a)^2 \times 10^{-3}$ electron volts, where n is the energy level and a is the thickness of the well times $10^6$ centimeters. For example, for a well thickness of 60 angstroms, a=0.6. There are approximately 15 energy levels in a well depth of approximately 10 electron volts, and the Fermi energy $E_F$ is approximately equal to 9 electron volts.

One of the advantages of the metal quantum well for solar energy conversion is the high absorption of solar photons, which are in the energy range of one electron volt. The high absorption for transitions between energy levels near the top level of the quantum well results from two factors. One factor is the oscillator strength, which is a measure of the absorption strength for transitions between energy levels in the quantum well. The other factor is the carrier density or population of electrons in each energy level. The oscillator strength for transitions between energy levels 14 and 15 of the above example is approximately 12, which is more than an order of magnitude larger than that attainable from the most heavily doped semiconductor quantum wells. The carrier density for these energy levels is on the order of $10^{15}$ electrons per square centimeter, which is several orders of magnitude larger than that available from the most heavily doped semiconductors. Since the absorption strength for specific transitions is proportional to the oscillator strength of a specific transition, such as the 1 volt transition from energy level 14 to energy level 15, times the population of the electrons for the transition, there is a huge advantage in the use of metal quantum wells for absorbing solar energy photons over semiconductor quantum wells.

Figure 4C:
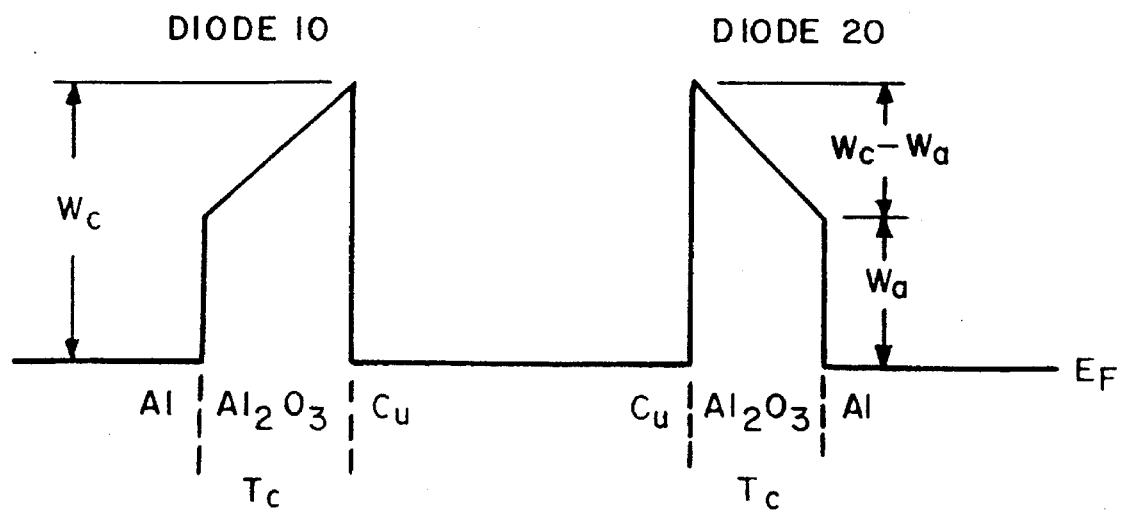
FIG. 4C is an energy level diagram for two quantum well diodes connected together for the case where the electrons in both quantum well diodes are at the same temperature.

An energy level diagram for the potential energy levels of two quantum well diodes connected together is shown in FIG. 4C. Each quantum well diode includes two quantum wells in thin metal films with different work functions. In each quantum well diode, the metal films are separated by a thin dielectric tunnel barrier. The energy level diagram of FIG. 4C corresponds to the reversible thermoelectric converter shown in FIG. 1. Diode 10 and diode 20 each comprises a copper film with a work function $W_c$ and an aluminum film with a work function $W_a$ separated by an aluminum oxide dielectric barrier. When the diodes are connected, the Fermi levels become the same throughout the circuit, and the work function difference, $W_c-W_a$, is the contact potential $V_c$ between the copper and aluminum quantum wells that exists across the aluminum oxide diode barrier. The electrons in diodes 10 and 20 are assumed to have the same temperature in the energy level diagram of FIG. 4C.

The Fermi levels become equal when the most energetic electrons in the aluminum film, which has a lower work function, flow into the copper film. The electron flow fills the energy levels in the copper film just above its Fermi level and depletes the energy levels in the aluminum film until equilibrium is reached. Equilibrium is reached when the highest filled energy levels in the copper and aluminum films are at the same energy and the total energy of the circuit is minimized. For the equilibrium state, the aluminum films become positively charged and the copper films become negatively charged. A potential difference, or contact potential, of $V_c=1$ millivolt between the copper and aluminum films results.

Figure 4D:
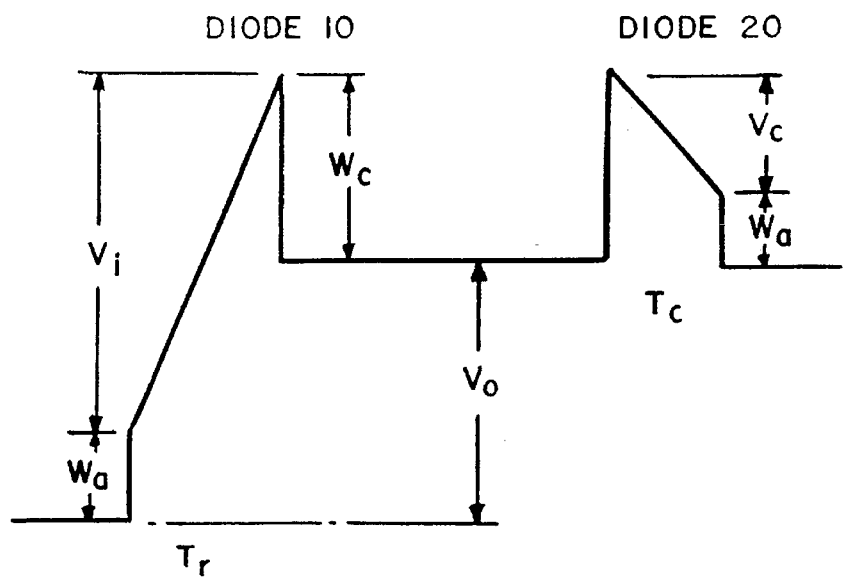
FIG. 4D is an energy level diagram for two quantum well diodes connected together for the case where the electrons in one quantum well diode have a higher temperature than the electrons in the other quantum well diode.

The energy level diagram for quantum well diodes 10 and 20 when the electrons in diode 10 are heated is shown FIG. 4D. The number of electrons at a higher temperature and a higher energy level than the Fermi level is much larger at the higher temperature. When the electrons in diode 10 are heated, the current flows in the opposite direction through diode 10 as compared with the case of reaching equilibrium at the lower temperature for diode 10. In the energy level diagram of FIG. 4D, it is assumed that the temperature $T_r$ of electrons in diode 10 is 6000° K. and that the temperature $T_c$ of electrons in diode 20 is 300° K. The new equilibrium for diode 10 results in the voltage across diode 10 becoming $V_r=(T_r/T_c)V_c=20$ millivolts. The increased voltage across diode 10 raises the Fermi level of the copper film of diode 10 so that there is an output voltage $V_o$ at the terminals 14 and 24 of the circuit of $V_o=V_r-V_c$ or $V_o=(1-T_c/T_r)V_r$. As a result, the output voltage $V_o$ is 19 millivolts for the equilibrium state when $T_r=6000°$ K. and $T_c=300°$ K.

Thus the electrons in each of the electrodes 40 and 42 are distributed in discrete energy levels determined by the temperature of the electrons and the material of the electrode. As the electrons are heated, they are distributed in higher energy levels and have a greater probability of crossing the potential barrier to the other electrode.

Figure 5:
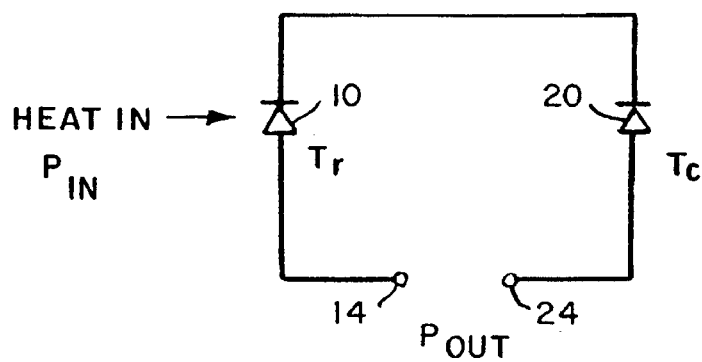
FIG. 5 is a schematic diagram showing the reversible thermoelectric converter used for conversion of thermal energy to electric energy.

Applications of the reversible thermoelectric converter of the present invention are shown schematically in FIGS. 5–8. In FIG. 5, the reversible thermoelectric converter is used for conversion of thermal energy to electric energy. Thermal energy $P_{in}$ is applied to quantum well diode 10. The thermal energy, which can be in the form of solar energy, is converted in diode 10 to hot photoelectrons at the temperature $T_r$ of the source. The electrons in diode 20 are at a low temperature $T_c$ relative to diode 10. The output electric energy $P_{out}$ appears at terminals 14 and 24.

Figure 6:
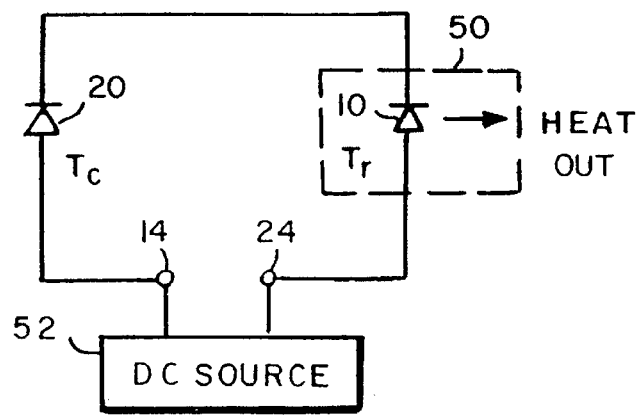
FIG. 6 is a schematic diagram showing use of the reversible thermoelectric converter as a heat pump.

Operation of the reversible thermoelectric converter as a heat pump is shown in FIG. 6. Thermal energy is absorbed by quantum well diode 20 at low temperature $T_c$ and thermal energy is given off by quantum well diode 10 at a higher temperature $T_r$. The diode 10 is typically located in a region 50 of essentially constant temperature $T_r$.

The reversible thermoelectric converter used as a heat pump differs from the use of the reversible thermoelectric converter for power conversion in that means is used to reverse the current through the diodes 10 and 20. Current reversal can be obtained by applying a voltage from a DC source 52 between the output terminals 14 and 24. Alternatively, a voltage can be applied between the terminals of diode 20 to obtain current reversal. The current reversal occurs when the voltage applied by DC source 52 has a larger magnitude and opposite polarity as compared with the open circuit output voltage of the reversible thermoelectric converter. The ratio of the open circuit voltage to the contact potential across the diode electrodes is given by $(T_r/T_c-1)$.

The reversible thermoelectric converter shown in FIG. 1 can be used to provide an AC power output. For AC operation, the current through the reversible thermoelectric converter is reversed cyclically so that the converter generates a cyclic electric or thermal power output. A cyclic input can be applied between the terminals 22 and 24 of the cold diode 20 so as to generate a cyclic output with the same waveform as the input. The frequency of the cyclic output power can be as great as the frequency corresponding to the relaxation time of the reversible thermoelectric converter, which can be less than $10^{-14}$ second. When a cyclic or AC input is used, the reversible thermoelectric converter can function as an amplifier.

Figure 7:
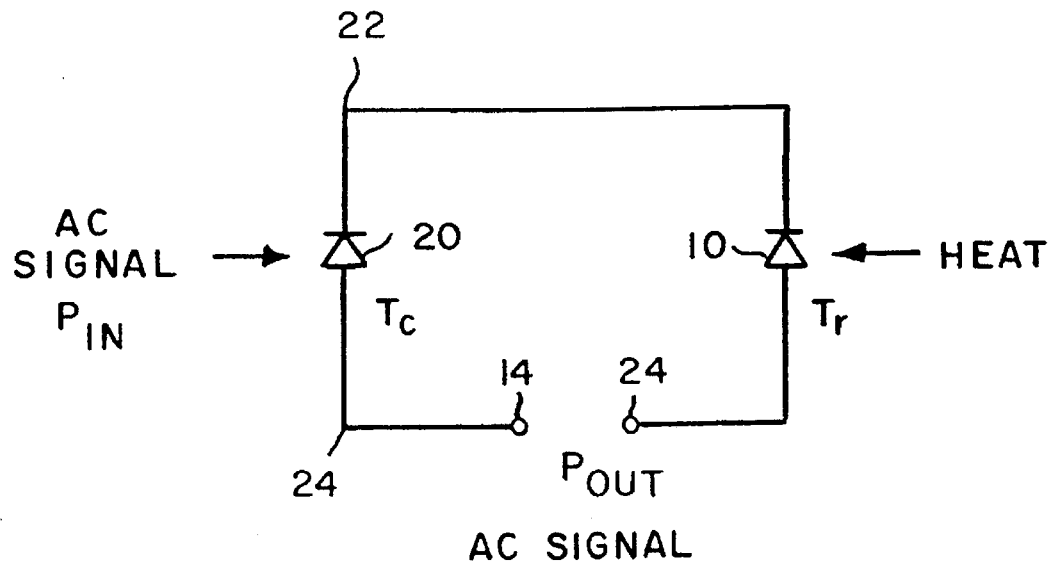
FIG. 7 is a schematic diagram showing use of the reversible thermoelectric converter as an amplifier.

Use of the reversible thermoelectric converter as an amplifier is shown schematically in FIG. 7. An AC signal $P_{in}$ is applied to quantum well diode 20 at a low temperature $T_c$ and input thermal energy is applied to quantum well diode 10 at a high temperature $T_r$. The AC signal $P_{in}$ can be in the form of thermal energy, such as optical photons, or in the form of electric energy, such as a voltage applied across terminals 22 and 24 of diode 20. The output electric energy $P_{out}$ is an AC signal with the waveform of the input signal $P_{in}$. The amplification factor is given by $(T_r^2/T_c^2)-1$, where the input AC signal is applied to the cold diode at temperature $T_c$ in the form of thermal or electrical energy.

By way of example, an input signal of 6 microwatts with a bandwidth of 1 gigahertz is applied to diode 20 either as thermal energy or electric energy, and thermal energy is applied to diode 10. A signal-to-noise ration of 60 dB is obtained for the input signal for a temperature $T_c$ of the cold diode 20 of 300° K. For a temperature $T_r$ of hot electrons in diode 10 of 6000° K., the amplification of the input signal is 26 dB, which gives an output signal of 2.4 milliwatts. The amplified output signal also has a 60 dB signal-to-noise ratio.

Figure 8:
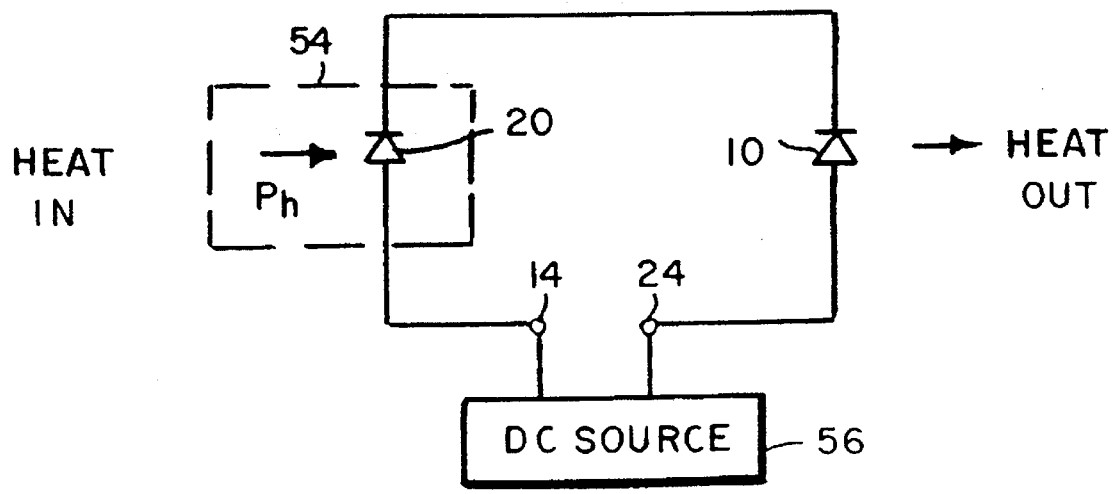
FIG. 8 is a schematic diagram showing use of the reversible thermoelectric converter as a refrigerator.

Use of the reversible thermoelectric converter as a refrigerator is shown in FIG. 8. In this case, thermal energy is transferred out of a low temperature region 54 at temperature $T_c$ containing quantum well diode 20, and thermal energy is given off by quantum well diode 10 at a higher temperature $T_r$. A DC source 56 connected between output terminals 14 and 24 causes the normal direction of current in the reversible thermoelectric converter to be reversed, as described above in connection with the heat pump of FIG. 6. The refrigeration cycle shown in FIG. 8 is similar in concept to the heat pump cycle shown in FIG. 6 and described above.

The quantum well structure in the quantum well diode contains the thermal energy of the hot electrons throughout the period of time required for the input thermal energy to be converted to electric energy by reversible electron transitions between energy levels. The quantum well diode serves a similar function for the heat pump process. The elimination of the requirement for a separate thermal barrier in the reversible thermoelectric converter of the present invention permits low cost, state of the art fabrication of the converter from thin films of common materials such as, for example, copper and aluminum.

The inherent difference between the classical reversible process and the quantum reversible process is that for the quantum reversible thermoelectric converter, the reversible process includes quantum size effects. As a result, circuit performance is based on quantum statistics. This difference results in a significant difference in performance.

All real processes are irreversible and are accompanied by an increase in entropy. However, processes using either classical or quantum statistics are defined as reversible processes when, in the limiting case, the entropy increase for the process becomes arbitrarily small and when the process is constituted of a succession of ordered equilibrium states.

The significant different in performance is the rate at which the system moves through the succession of equilibrium states. To approach the limiting case for the classical reversible process, the system is constrained to move with infinite slowness through the succession of equilibrium states. For a quantum reversible process, the movement through the succession of equilibrium states can occur at the rate of spontaneous fluctuations. Therefore, the rate of succession of equilibrium states for the quantum reversible process can, as stated by W. Band in *Quantum Statistics*, D. Van Nostrand Company, Inc., New York, 1955, pp. 38–40, in the limit, proceed at a finite speed depending only on the fluctuation spectrum of any equilibrium state.

The fluctuation spectrum of the reversible process includes frequencies up to optical frequencies. The rate of the succession of equilibrium states for the conversion of solar energy is within this fluctuation spectrum and is controlled by the incoming of increments of solar thermal energy. These increments, in the range of an electron volt of energy, are in the form of photogenerated hot electrons at the source temperature $T_r$ incoming to the electrodes of the quantum well diode that is operating as the hot diode in the reversible thermoelectric converter.

The thermal energy of each hot electron is transferred into an increment of electromagnetic energy in the quantum reversible thermoelectric converter by transition between the energy levels of the quantum wells at the equilibrium state for the temperature $T_r$. This increment of electric energy of the equilibrium state is directed converted into an incremental electric energy output with an efficiency approaching that of the Carnot cycle by transitions between the energy levels of the quantum wells in the electrodes of the cool quantum well diode at circuit temperature $T_c$.

Transitions over a wide range of energy level differences in the quantum wells are involved in the transformation of approximately one electron volt of thermal energy into the electric energy output. The electric energy output consists of many electrons of lesser energy and at a corresponding smaller output voltage as given by the output voltage of the equilibrium state of the quantum reversible thermoelectric converter.

The electromagnetic energy stored in the higher energy levels of the quantum wells in the quantum well diodes from incoming thermal energy, develops as the output voltage of the quantum reversible thermoelectric converter. The output voltage $V_0$ for the equilibrium state is given by $$V_o = V_i - V_c \tag{1}$$

where $V_i$ is the voltage across the hot diode receiving the incoming thermal energy and $V_c$ is the voltage across the cold diode. The Boltzmann factor for the ratio of $V_i$ to $V_c$ at the equilibrium state is $$V_i/V_c = T_r/T_c \tag{2}$$

where $T_r$ is the temperature of the source and $T_c$ is the temperature of the cold diode. From these equations, the output voltage $V_0$ for the equilibrium state is given by $$V_o = (T_r/T_c - 1)V_c \tag{3}$$

This analysis of the intrinsic power conversion process is limited to the energy conversion in the quantum wells of the quantum well diodes for the equilibrium state. The practical irreversible extrinsic losses of the reversible thermoelectric converter and the external solar energy collection system are determined on a cost effective basis for each application. However, the potential intrinsic reversible efficiency of the quantum well diode is a constant factor for each application, for each level of solar energy intensity ranging from below the level of direct sunlight up to the level for maximum concentration, and for each environment within the structural and electrical limits on temperature of the materials in the quantum well diodes.

The conversion of thermal energy of each hot electron into electromagnetic energy occurs in a time interval that is short compared to the relaxation time of dissipative loss sources. These loss sources include the dissipative losses from the collisions of incoming hot electrons with the crystal lattice of the quantum well diodes. The power conversion process and all other processes in the reversible thermoelectric converter are essentially nondissipative for all interactions, since the crystal lattice effectively performs a function of an adiabatic thermal barrier. The relaxation time for the transition between equilibrium states is sufficiently short so that all the processes for the quantum reversible thermoelectric converter of the invention approach reversibility.

A reversible process is a process with an ordered succession of equilibrium states for which no dissipative losses occur during the transitions between equilibrium states. For the quantum statistics applicable to the transitions between energy levels in quantum wells, the succession of ordered equilibrium states can occur at a finite speed. Therefore, a statistical reversible process can be achieved for transitions between the energy levels of quantum wells. A reversible circuit element is a circuit element with no inherent dissipative losses to prevent the circuit element from being a component of a reversible process. A reversible cycle is an idealized abstraction in classical thermodynamics, since the system is required to move with infinite slowness through a succession of equilibrium states in order for the process to be reversible. This is not the case for the reversible cycle of the present invention, since this reversible cycle is based on quantum statistics controlling the energy transitions. As discussed in more detail below, the reversible process requires that the conversion of thermal energy into electric energy occurs in a time that is short compared to the thermal relaxation time of the dissipative loss sources.

It has been demonstrated that tunnel diodes can rectify an optical frequencies, and recent work has shown that the electron photon thermalization times of hot electrons in devices can be longer by two or three orders of magnitude than the hot electron barrier crossing time in a tunnel diode. The analysis of the barrier crossing time shows the potential for this time to be as short as $10^{-15}$ second for tunnel diodes. For the measurements being recorded, this barrier crossing time is estimated to be of the order of $10^{-15}$ second for a 10 angstrom thick barrier crossing by a ballistic electron with a $10^8$ cm per second velocity.

The response time of the quantum reversible thermoelectric converter can be computed using the relaxation times of the quantum well diodes. To the first order in the expansion of the fluctuation spectrum of the reversible thermoelectric converter with electrically equivalent hot and cold diodes, the relaxation time $t_r$ is given by $$t_r = (kT_c/e)(C/A) \qquad (4)$$

where $T_c$ is the temperature of the cold diode, C is the capacitance of the quantum well diode and A is the saturation current for the electrodes of the hot diode. The relaxation time $t_r$ is a function of the temperatures $T_r$ and $T_c$ for the conversion of solar energy by the quantum reversible thermoelectric converter $T_r$ can be as low as $10^{-15}$ second. This relaxation time is short compared to the relaxation time of all dissipative loss sources including the dissipative losses from the collisions from incoming hot electrons within the crystal lattice of the quantum well diodes.

The design of the quantum well diodes for the reversible thermoelectric converter is a function of the application, and the effective temperature and intensity of the source of hot electrons. Several applications of the reversible thermoelectric converter are discussed below. In an example of a thin film metallic quantum well diode suitable for the conversion of solar energy concentrated up to $10^7$ watts per square meter, layer 42 (FIGS. 2 and 3) is an evaporated aluminum film having a thickness of 140 angstroms, barrier layer 44 is evaporated aluminum oxide having a thickness of 12 angstroms and layer 40 is an evaporated copper film having a thickness of 100 angstroms. For this energy conversion application, metal electrodes are specified since amounts of power as large as concentrated solar energy can be delivered by the quantum reversible thermoelectric converter. The high power output capability results from the large electron carrier density of metals, which can be orders of magnitude larger than the most heavily doped semiconductors.

For the electrodes of the quantum well diodes, high conductivity metals such as copper, aluminum silver, gold, nickel and magnesium provide high carrier densities, large oscillator strengths for the energy level transitions and low resistance to the output current. For the dielectric material of the diode barrier in the quantum well diodes, dielectric materials such as $Al_2O_3$, $SiO_2$ and SiO can be used. As discussed above, a contact potential $V_c=1$ millivolt for copper and aluminum electrodes using concentrated solar radiation input intensity is sufficient to obtain a practical output voltage with minimum transmission and thermalization losses. The contact potential can be varied by selection of metals with different work functions.

For the power conversion of thermal energy having lower intensity than concentrated solar energy, the thickness of the metal film electrodes. can be reduced. Reducing the thickness of the electrodes to below 100 angstroms increases the oscillator strength, reduces the carrier density and decreases the thermalization loss rate for the quantum energy states. As the thickness of the diode electrode is reduced, the quantum well size decreases and the lifetime of the quantum states is lengthened. This increases the thermalization time for lattice states so as to further reduce thermalization losses.

The thermalization time for the quantum states of the quantum well diode is also a function of temperature. As described below, the heat pump process can be combined with the power conversion process in a two-stage reversible thermoelectric converter to reduce the temperature of the cold diode in the power conversion stage so as to increase the thermalization time and thereby reduce thermalization losses. The decrease in temperature of the cold quantum well diode increases the lifetime of the crystal lattice states and decreases the time constant of the quantum well diode, which enables the conversion time of the thermal energy to be decreased.

In order to reduce thermalization loss during energy conversion in the reversible thermoelectric converter, the energy conversion time $t_c$ can be controlled relative to the thermalization time $t_{ep}$ of all loss sources. Specially, the conversion time $t_c$ must be less than the thermalization time $t_{ep}$. The conversion time $t_c$ is the time that energy is stored in the quantum wells of the quantum well diode. The conversion time for the reversible conversion of incoming thermal energy into output electrical energy must be less than the expected lifetime of the quantum states in the quantum well diodes. The energy conversion time $t_c$ for an output voltage $V_o$, to deliver an output power $P_o$ is given by:

$$t_c = (CV_o^2)/(2P_o) \qquad (5)$$

where C is the capacitance across the quantum well diodes. As indicated in Equation (3) above, the output voltage $V_o$ is proportional to the voltage $V_c$ across the cold diode which is the contact potential of the quantum well diode. Equations (3) and (5) show that the conversion time $t_c$ is a function of the diode contact potential $V_c$. Thus, the conversion time $t_c$ can be reduced by lowering the contact potential $V_c$. Also, for the lower input power levels, the conversion time $t_c$ can be maintained less than the thermalization time $t_{ep}$ and the reversible power conversion process can be maintained by lowering the contact potential $V_c$ as the power level $P_o$ decreases. In general, the voltage $V_c$ across the cold diode can be varied in order to maintain the conversion time $t_c$ less than the thermalization time $t_{ep}$ by varying the design of the quantum well diode, or by applying a suitable voltage to the quantum well diode.

The discussion thus far has been directed primarily to input thermal energy in the form of solar energy at a source temperature of 6000° K. It will be understood that the reversible thermoelectric converter of the present invention can be utilized at a variety of different intensity levels and photon energy levels with appropriate scaling. When the input thermal energy has a lower temperature, the quantum well dimensions are scaled in width and/or depth so that the transitions between energy levels near the top of the quantum wells are at energy levels corresponding to the energy of the photons of the incoming radiation energy.

Scaling the depth of the quantum wells can be accomplished by selecting a material for the diode electrodes with lower electron densities. Semiconductor materials can be used in place of metals to provide lower electron densities. For example, by using heavily doped gallium arsenide, the electron carrier density is approximately $10^{13}$ electrons per square centimeter. For electrodes having a thickness of 80 angstroms, the quantum well depth is approximately 0.3 electron volt. This quantum well has three energy levels with transitions between energy levels of approximately 0.1 electron volt. This transitions are at approximately one-tenth of the energy and equivalent temperature of solar photons. The smaller depth quantum wells have a maximum absorption strength for much lower temperatures. However, there is a decrease in the carrier density of the semiconductor quantum well by a factor of 100 and a decrease in the oscillator strength by a factor of 10 in comparison with metal quantum wells. In addition, a reduction in the number of energy levels reduces the number of transitions required to transform the incoming voltage of the hot electrons down by a factor of 100 to the millivolt levels of the output voltage of the reversible thermoelectric converter.

A preferred technique for absorbing lower temperature photons in the quantum wells of the quantum well diodes is to increase the thickness of the metal quantum wells. For the example described above wherein the metal quantum wells have thicknesses of 100 angstroms and 140 angstroms, the transitions between the energy levels at the top of the 10 volt metal quantum wells is approximately 0.2 volt and 0.3 volt. The thickness of the electrodes is increased so as to maximize the absorption strength for the temperature of the heat source. Then for the selected thickness, Equation (5) is used to determine the value of contact potential $V_c$ that is required to maintain reversible power conversion for the lower temperature heat source.

The lifetime of the individual quantum state is in the range of from approximately $10^{-12}$ second to longer values as a function of the quantum well size and the carrier density. For the quantum reversible thermoelectric converter, the time required for conversion of thermal energy of hot electrons to electric energy can be two or three orders of magnitude shorter than the estimated lifetime of energy levels of the electron standing waves.

The absorption strength of the metal quantum well diode is orders of magnitude better than that for semiconductor solar cells. This result follows the order of magnitude improvement in the oscillator strength at the required quantum energy levels for metallic quantum well diodes in comparison with semiconductor diodes. This result, in turn, follows from the increase in the dipole moments for the adjacent commensurate states in the quantum well diodes in comparison with the oscillator strength between adjacent energy levels in semiconductor diodes. The large increase in both the absorption strength of the thin metal electrodes of the quantum well diode and the orders of magnitude increase in the density of electrons in the thin metal electrodes of the quantum well diode enables the reversible thermoelectric converter of the present invention to be orders of magnitude smaller than an equivalent semiconductor solar cell.

A series of experiments was undertaken to determine the performance potential of the quantum reversible thermoelectric converter of the present invention. Tests were performed with a quantum well diode, as shown in FIGS. 2 and 3, that is designed for use in concentrated solar energy. The circuit is shown in FIG. 1. Diodes 10 and 20 were fabricated in accordance with the example described above, including a 12 angstrom layer of aluminum oxide between a 140 angstrom layer of aluminum and a 100 angstrom layer of copper. Hot electrons were photogenerated by nanosecond pulses of visible light directed at diode 10. The pulses of light were generated by a Nd:YAG laser.

The reversible hot electron transitions between the quantum well energy levels for a hot electron temperature of 6000° K. develop a maximum output voltage of 20 millivolts for the equilibrium state. The available power output from the active area of the quantum well diode is $10^7$ watts per square meter. The intrinsic efficiency of the conversion of thermal energy of the hot electrons to electromagnetic energy is computed from the measured maximum output voltage of 20 millivolts and the measured contact potential of the quantum well diodes of 1 millivolt.

The contact potential is obtained from the values of the maximum output voltage of the reversible thermoelectric converter with each of the quantum well diodes in a separate heat reservoir over a range of temperature differences between diodes 10 and 20 of 100° K. These measurements are made for temperatures of the separate reservoir for diodes 10 and 20 in the range of 300° K., then from Equation (3) for the output voltage, the value of the contact potential is given by the measured values of $T_r$, $T_c$ and $V_0$ over this range of temperatures for diodes 10 and 20. This value of contact potential is used in the equation for the value of $V_0$ for the equilibrium state.

The intrinsic efficiency of the conversion process at the equilibrium state output voltage of 20 millivolts is given by $$E = V_o/V_i \tag{6}$$

where $V_i$ is input voltage to diode 10 and where $$V_i = V_o + V_c \tag{7}$$

Equation (6) gives the power conversion efficiency of the increment of electric energy from each hot electron. This equation is in terms of voltage only, since the output charge is equivalent to the input charge for each voltage transition for each ordered succession of incremental changes in the equilibrium state. From Equations (6) and (7), the intrinsic efficiency is given by $$E = (1 + V_c/V_o)^{-1} \tag{8}$$

Using the measured output voltage $V_0$ of 20 millivolts and the measured contact potential $V_c$ of 1 millivolt, the value obtained for E is 95%. This is the same value for E as given by the Carnot limit, $E = (1 - T_c/T_r)$, where $T_c$ is 300° K. for the cold diode and where $T_r$ is 6000° K. for the temperature of the source of the photogenerated hot electrons.

The above test used diodes with active diode areas of $10^{-4}$ cm$^2$ as convenient to the fabrication and the tests. In the theory of the quantum reversible process, the output voltage is not dependent on the area of the diode electrodes. The test results do not support the existence of any electron thermalization process in which any significant fraction of the hot electrons is first thermalized to an equilibrium temperature for electrons. This thermalization process is not compatible with the experimental results, since approximately $10^{13}$ watts per square meter of input power is needed to heat the thermalized electrons to the electron temperature of 6000° K. for an electron photon thermalization time of $10^{-12}$ seconds. This electron thermalization process is also not a physically realizable process for this input power, since the material of the diode is destroyed in less than $10^{-12}$ seconds by this intensity of incoming photons. This power is 6 orders of magnitude larger than the test power for the conversion process of $10^7$ watts per square meter that was used in the experiment. These results support the conclusion that the thermal energy of the hot electron is directly converted into electromagnetic energy before any electron thermalization occurs.

In summary, the measurements of power conversion by the reversible processes of the reversible thermoelectric converter of the present invention support the predicted theoretical results that the conversion occurs in a time less than the relaxation time of the energy levels of electron standing waves in the quantum well diodes. This conclusion is supported by the energy considerations for quantum size effects, heat equation results and laser power input. These experimental results also support the theoretical result that the thermodynamic cycle of the quantum reversible thermoelectric converter is reversible.

Figure 9:
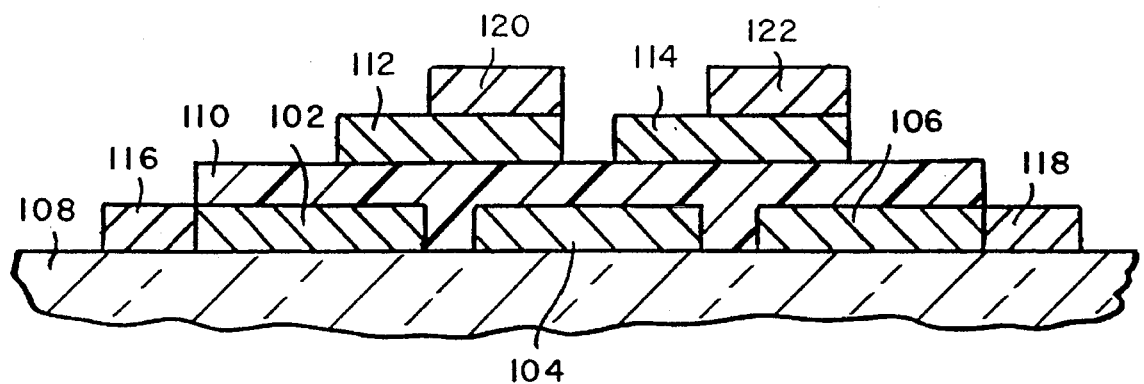
FIG. 9 is a cross section of a planar array of reversible thermoelectric converter devices in accordance with the invention.

An example of a planar array of reversible thermoelectric converter devices for the conversion of solar energy to electric energy is shown in FIG. 9. The array includes parallel, spaced-apart strip electrodes 102, 104 and 106 formed on a glass substrate 108. A dielectric barrier layer 110 is formed over electrodes 102, 104 and 106. Parallel, spaced-apart strip electrodes 112 and 114 are formed on barrier layer 110. Terminals 116 and 118 formed on substrate 108 are attached to electrodes 102 and 106, respectively. Reflecting layers 120 and 122 are formed on portions of strip electrodes 112 and 114 to reflect the incoming solar energy from the cool diode in the reversible thermoelectric converter.

In a first embodiment of the planar array, electrodes 102, 104 and 106 are aluminum films, dielectric barrier 110 is an aluminum oxide layer, and electrodes 112 and 114 are copper films. A schematic diagram of the first embodiment of the planar array of FIG. 9 is shown in FIG. 9A.

Electrodes 102 and 112 separated by barrier layer 110 constitute a first diode 113, and electrodes 104 and 112 separated by barrier layer 110 constitute a second diode 115. The first and second diodes 113, 115 have the same electrical configuration as the diodes 10 and 20 of FIG. 1 and form a first reversible thermoelectric converter array element. The electrodes 104 and 114 separated by barrier layer 110 constitute a third diode 117, and electrodes 114 and 106 separated by barrier layer 110 constitute a fourth diode 119. The third and fourth diodes 117, 119 have the same electrical configuration as the diodes 10 and 20 of FIG. 1 and form a second reversible thermoelectric converter array element. The first and second reversible thermoelectric converter array elements are connected in series between terminals 116 and 118, as shown in FIG. 9A.

Figure 9A:
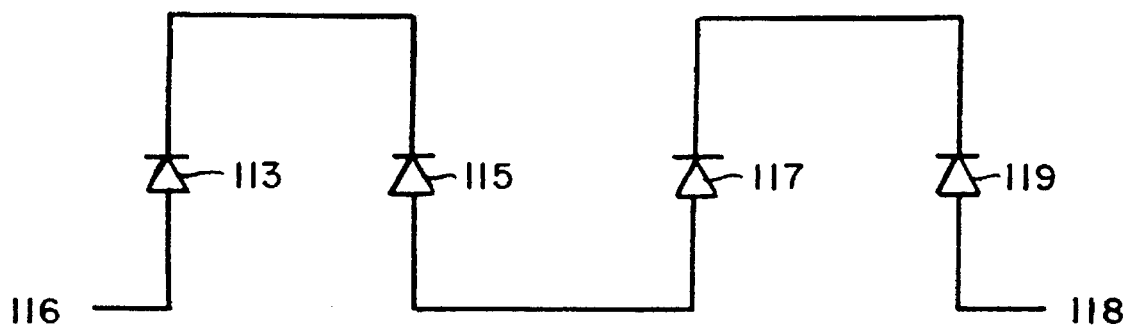
FIG. 9A is a schematic diagram of a first embodiment of the planar array of FIG. 9.

The first embodiment of the planar array shown in FIG. 9A comprises a series connection of two reversible thermoelectric converter array elements between terminals 116 and 118. The array structure shown in FIG. 9 can be extended to provide additional reversible thermoelectric converter array elements connected in series and can be extended in a direction perpendicular to the plane of FIG. 9 to add reversible thermoelectric converter array elements in parallel. The output voltage from terminals 116 and 118 increases linearly as the number of reversible thermoelectric converter array elements connected in series increases, and the current output from terminals 116 and 118 increases linearly as additional reversible thermoelectric converter array elements are added in parallel.

The output power from terminals 116 and 118 increases linearly as the total active area of the array elements increases for a constant power input per unit area. From the experimental results discussed above, the power output available per square centimeter of active area of the quantum well diodes in the planar array shown in FIG. 9 is one kilowatt for concentrated solar energy input.

Figure 9B:
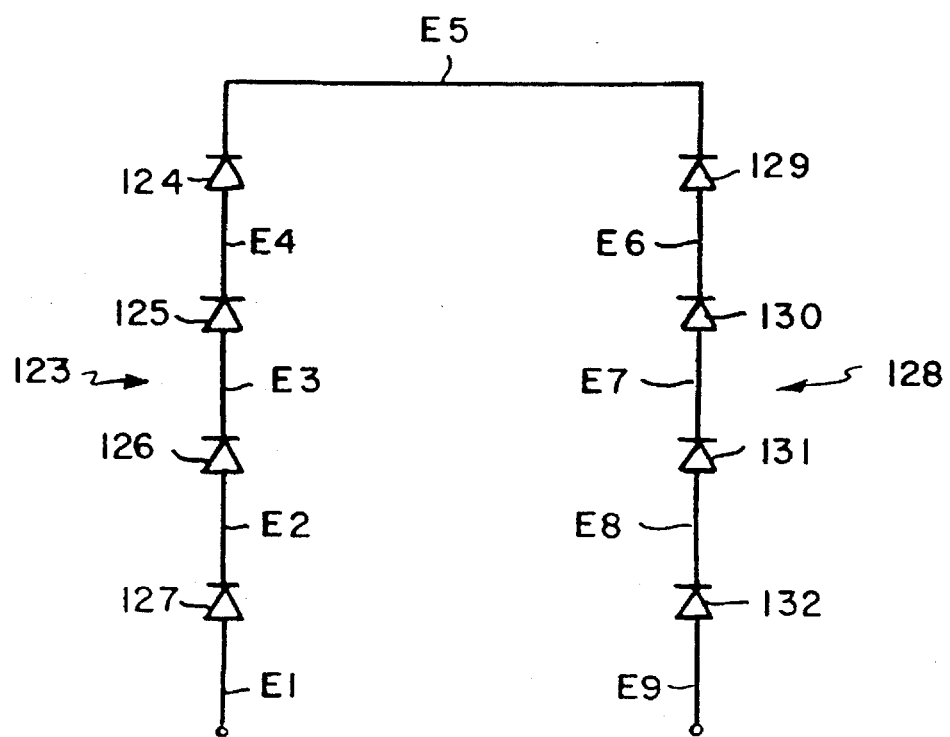
FIG. 9B is a schematic diagram of a second embodiment of the planar array of FIG. 9.

A second embodiment of the planar array, wherein the first diode of the reversible thermoelectric converter comprises a multiple electrode diode having n pairs of electrodes and the second diode comprises a multiple electrode diode having n pairs of electrodes, is shown in schematic form in FIG. 9B. A first multiple electrode diode 123 comprises diodes 124, 125, 126 and 127 connected in series. A second multiple electrode diode 128 comprises diodes 129, 130, 131 and 132 connected in series. The multiple electrode diode 123 corresponds to diode 10 shown in FIG. 1, and multiple electrode diode 128 corresponds to diode 20 shown in FIG. 1. Each of the diodes 124–127 and 129–132 comprises a pair of electrodes. Thus, n=4 for multiple electrode diode 123 and n=4 for multiple electrode diode 128. Multiple electrode diodes 123 and 128 can be fabricated on the same substrate or on different substrates. One significant advantage of fabricating multiple electrode diodes 123 and 128 on separate substrates is that the multiple electrode diodes can be in different locations. Thus, the multiple electrode diode 123 can be located in a hot environment to receive incoming radiation, and the multiple electrode diode 128 can be located in a cold environment.

In order to implement the multiple electrode diodes 123 and 128 shown in FIG. 9B, fixed voltage increments must be added to each pair of electrodes. For example, diode 126 must operate at a higher voltage than diode 127, diode 125 must operate at a higher voltage than diode 126, etc. The voltage increments can be achieved in several ways. Typically, the electrode pairs of each diode are fabricated of the same metal, such as copper. Thus, referring again to FIG. 9, electrodes 102, 104, 106, 112 and 114 are all fabricated of the same metal.

In a first technique for obtaining voltage increments, successively larger doses of ions are implanted in the electrodes of each diode in the multiple electrode diode. For example, a given number of ions is implanted in electrodes of diode 127, a larger number of ions is implanted in the electrodes of diode 126, a still larger number of ions is implanted in the electrodes of diode 125, etc.

Figure 9C:
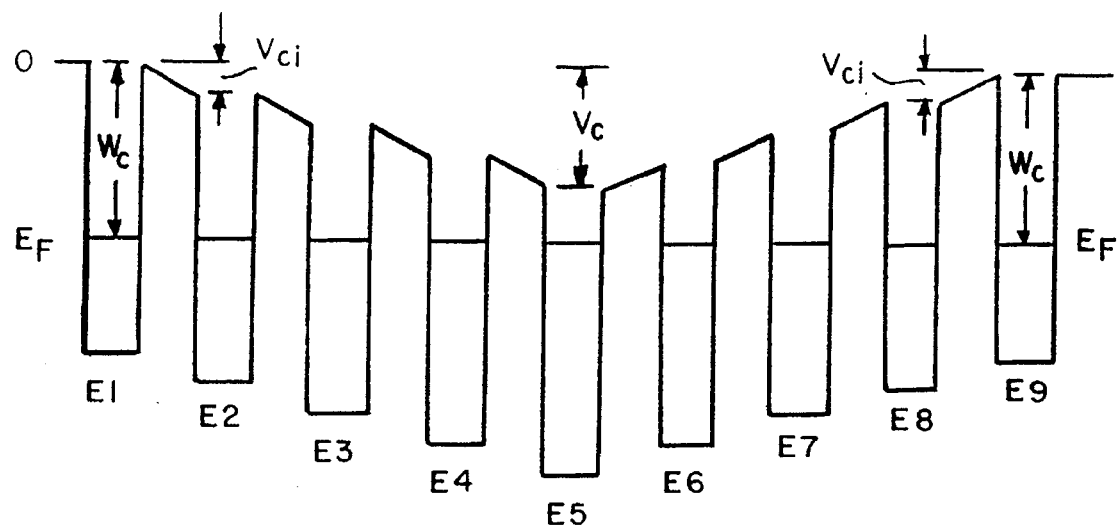
FIGS. 9C and 9D are energy level diagrams of the reversible thermoelectric converter of FIG. 9B, with no thermal energy input and with thermal energy input, respectively.

In the ion implantation technique, ions such as aluminum ions are implanted in an insulating layer adjacent to one of the electrodes of each successive pair of electrodes. For example, with reference to FIG. 9, the increments of charge provided by the implanted ions can be implanted in the substrate layer 108 adjacent to electrodes 102, 104 and 106. In this configuration, the electrodes can all be of a common metal such as copper, since the implanted ions apply the electric field for the series contact potential of each pair of electrodes. The field lines of the applied electric field from the charges of the implanted ions run from electrode 102 to electrode 112, then to electrode 104, then to electrode 114 and then to electrode 106. The electric field lines cause a contact potential as shown in FIG. 9C.

According to a second technique for obtaining the voltage increments in the multiple electrode diode, the metal electrodes of each diode are doped with atoms of a different material to change the ratio of electrons to atoms of the dopant material in the metal film. The number of atoms added to the metal film is successively increased in diodes 127, 126, 125, etc.

One example of doping electrodes with atoms of a different material to obtain voltage increments involves using a bismuth-lead alloy for the electrodes of the diodes in the series array and increasing the percentage of bismuth in each successive pair of electrodes. This raises the Fermi level for each successive pair of electrodes, since bismuth has five electrons per atom and lead has four electrons per atom. Thus, the required increment of voltage is added to each pair of electrodes.

According to a third technique for obtaining voltage increments, materials with successively larger work functions are used in the diodes of the multiple electrode diode. Thus, for example, the electrodes in diode 126 have a larger work function than the electrodes in diode 127, etc.

According to a fourth technique for obtaining voltage increments, electric fields are applied to the diodes in the multiple electrode diode to achieve the required voltage increments. This technique is described below in connection with FIGS. 14 and 14A. It will be understood that the techniques described above for providing voltage increments in the multiple electrode diode can be used separately or in combination.

Figure 9D:
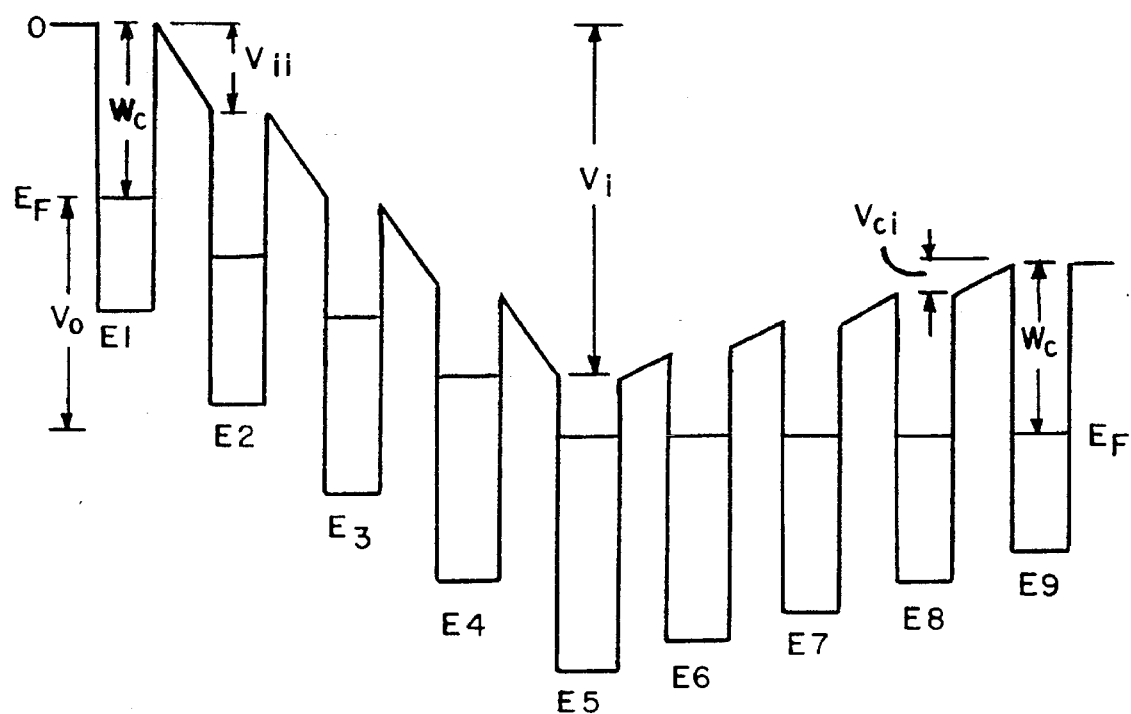

Energy level diagrams for the reversible thermoelectric converter of FIG. 9B are shown in FIGS. 9C and 9D. In order to simplify the energy level diagrams, each electrode shown in FIGS. 9C and 9D represents the electrodes of adjacent diodes connected by a conducting lead of the same metal having no resistance. The electrodes of diodes 127, 126, 125 and 124 are represented by E1, E2, E3, E4 and E5, respectively. Similarly, the electrodes of diodes 129, 130, 131 and 132 are represented by E5, E6, E7, E8 and E9, respectively. In FIG. 9C, the energy levels are shown for the diodes connected in series with fixed negative increments of voltage $V_{ci}$ between the quantum wells of the diodes 124–127 of the multiple electrode diode 123. Fixed positive voltage increments $V_{ci}$ are added between the quantum wells of the diodes 129–132 of multiple electrode diode 128. The voltage increments are provided in accordance with the techniques described above. The contact potential $V_c$ of each of the multiple electrode diodes 123 and 128 is the sum of the voltage increments $V_{ci}$.

The energy level diagram of FIG. 9C represents a case where no radiation is applied to the hot diode of the reversible thermoelectric converter. The sum of the four voltage increments $V_{ci}$ is the effective contact potential $V_c$ of the series connection of the four pairs of electrodes. The effective contact potential is $V_c$ for multiple electrode diode 123 and for multiple electrode diode 128. The conversion time $t_c$ is reduced by $n^2=16$ for the example given where n=4.

The energy level diagram of FIG. 9D illustrates a case where thermal energy is input to each of the diodes 124–127 in multiple electrode diode 123. The thermal energy increases the temperature of the electrons in the quantum wells of the electrodes 124–127 so that the ratio of the temperature $T_r$ of the multiple electrode diode 123 to the temperature $T_c$ of the multiple electrode diode 128 is $T_r/T_c=3$. Substituting this ratio into equation (2) gives the ratio of $V_{ii}$ to $V_{ci}$ in the energy level diagram, where $V_{ii}$ is the input voltage to each pair of electrodes resulting from the input of thermal energy. As shown in FIG. 9D, the resulting output voltage $V_o$ of the multiple electrode diode 123 and multiple electrode diode 128 is $V_o=2 V_c$.

The series connection of reversible thermoelectric converter array elements as shown in FIG. 9 permits independent control of output voltage and contact potential in the diodes of each array element. By using array elements connected in series, the desired array output voltage $V_{oa}$ can directly be obtained. The relation between the power output and the voltage output of each array element enables the reversible power conversion to be achieved by the planar array shown in FIG. 9 for each application.

The requirements for the planar array to achieve reversible power conversion are 1) a conversion time $t_c$ must be less than the thermalization time $t_{ep}$, and 2) the voltage to current ratio must be sufficient for the transmission of the power output of the first diode to the second diode of the array element with a minimum heat loss.

To meet the first requirement for each array element, the value of $V_{ii}^2/P_{ii}$ is maintained less than the value of $2t_{ep}/C$, where $V_{ii}$ is the input voltage to each pair of electrodes, $P_{ii}$ is the power input to each pair of electrodes, and C is the capacitance of each pair of electrodes in the array element. This requirement follows from equation (5) and the requirement that the conversion time $t_c$ be less than the thermalization time $t_{ep}$.

To meet the second requirement for each array element, the value of the ratio $V_o^2/P_o$ is maintained greater than the value R, where $V_o$ is the output voltage, $P_o$ is the output power of the array element and R is the resistance of the conducting lead between the first and second diodes of the array element. This limit on the minimum value of $V_o$ insures that the heat power loss in the conducting lead between the first diode and the second diode of the array element is minimized.

To meet the second requirement for each array element, the first diode and the second diode of each array element can be comprised of a series array of n pairs of electrodes, with each pair of electrodes meeting the requirement for maintaining the ratio of $V_{ii}^2/P_{ii}$ less than the value of $2t_{ep}/C$ and the second requirement for maintaining the sum of the output voltage from the n pairs of electrodes greater than the value of R, the number n of pairs of electrodes must be larger than the value given by $RC/t_{ep}$.

The input voltage to each pair of electrodes is $V_i/n$, and the energy stored in each pair of electrodes is proportional to $(V_i/n)^2$, where $V_i$ is the input voltage to an array element. In the series array, the total stored energy for each pair of electrodes is reduced by a factor of $n^2$ for a given output voltage $V_o$ for each array element, and the conversion time $t_c$ for each array element is reduced by a factor of $n^2$ in comparison with the configuration where a single pair of electrodes is used for the first diode and a single pair of electrodes is used for the second diode to provide an output voltage $V_o$.

In designing an array of reversible thermoelectric converters, the contact potential $V_{ci}$ is selected to maintain the conversion time $t_c$ less than the thermalization time $t_{ep}$ as discussed above. Then the number n of electrodes for the multiple electrode diode 123 and the multiple electrode diode 128 to obtain the desired output voltage $V_o$ is selected. The configuration shown in FIG. 9B comprises a single thermoelectric converter array element that is functionally equivalent to FIG. 1. Multiple array elements of the type shown in FIG. 9B can be connected in series as shown in FIG. 9A to provide increased output voltage. The number of array elements connected in series is selected to obtain a desired array output voltage $V_{oa}$.

The above-described technique for selecting contact potential $V_{ci}$, the number n of pairs of electrodes in each array element and number of array elements in series is applicable to all energy intensity levels and all temperature levels. This technique permits operation of the reversible thermoelectric converter of the invention at relatively low intensity levels and low temperature levels. At lower temperature levels, the technique can be used in conjunction with the above-described technique for increasing the thickness of the quantum wells of the quantum well diodes as a function of the incoming energy so as to maximize the absorption strength of the quantum well diodes.

A further option with respect to the planar array described above is to increase the fraction of the planar array area that is used by the multiple electrode diode 123 (that corresponds to diode 10 in FIG. 1). This is achieved by increasing the contact potential increment $V_{ci}$ for the multiple electrode diode 128 (which corresponds to diode 20 in FIG. 1) up to the limit established by the ratio of the input temperature $T_r$ to the cold reservoir temperature $T_c$. The ratio of the energy stored in the multiple electrode diode 123 to the energy stored in the multiple electrode diode 128 is given by the temperature ratio $T_r/T_c$. The increase in the contact potential increment $V_{ci}$ up to the limit set by the ratio $T_r/T_c$ in turn establishes a limit of the ratio of the areas of the multiple electrode diode 123 to the area of the multiple electrode diode 128.

A second option with respect to the planar array is to increase the output voltage $V_o$ by increasing the number n of pairs of electrodes without an increase in the output current of the array element. The increase in the ratio of the output voltage to the output current permits the multiple electrode diodes 123 and 128 to be separated, while maintaining a minimum resistive loss. Thus, the multiple electrode diode 123 for receiving thermal energy for the power conversion or heat pump process has maximum area at the receiving location. The configuration with separated hot and cold diodes is preferred in applications such as positioning the hot diode inside a furnace, and the cold diode outside the furnace, or the hot diode on a home roof and the cold diode inside the home.

A further option with respect to the planar array is to use different numbers of pairs of electrodes in the hot multiple electrode diode 123 and the cold multiple electrode diode 128 so as to transform the voltage-to-current ratio of the input energy of the hot electrons to the required voltage-to-current ratio of the output energy. This configuration can be used to transform the energy of optical photons incoming to the multiple electrode diode 123 to energy outgoing from the multiple electrode diode 128 with a voltage level ranging from below one millivolt to the electron voltage level of optical photons.

Figure 10:
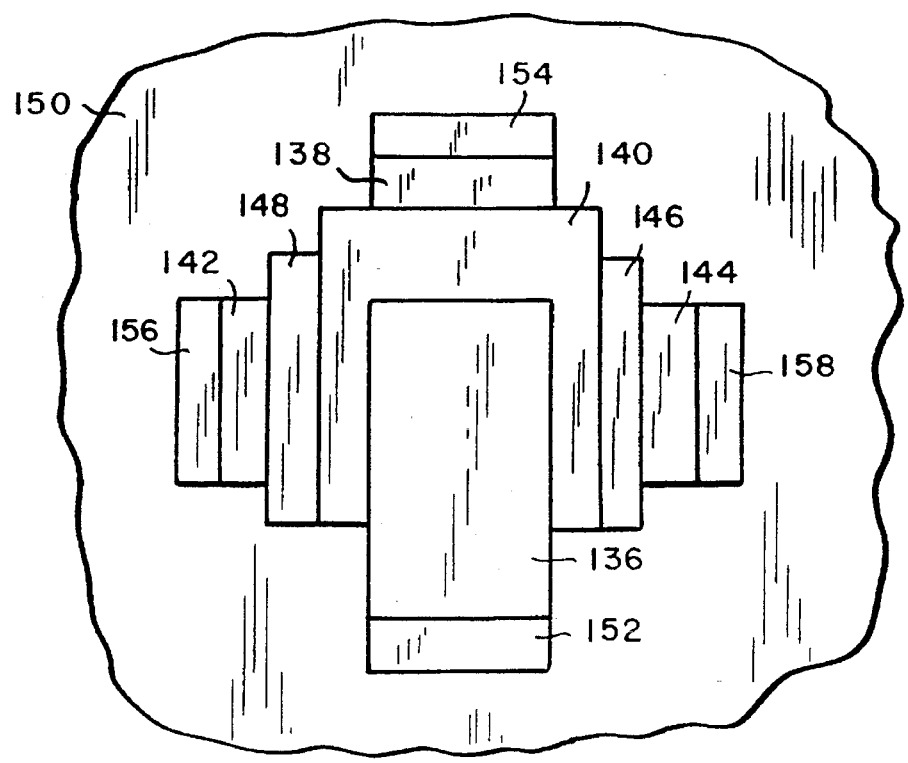
FIG. 10 is a top view of a nonplanar reversible thermoelectric converter fabricated in a vertical stacked array.

A nonplanar reversible thermoelectric converter circuit is shown in FIG. 10. In the nonplanar circuit, the quantum well diodes are fabricated in a vertical stacked array. A quantum well diode comprising electrode layers 136 and 138 separated by a barrier layer 140 corresponds to diode 10 in FIG. 1. A quantum well diode comprising electrodes 142 and 144 separated by a barrier layer 146 corresponds to diode 20 in FIG. 1.

The upper diode is separated from the lower diode by a barrier layer 148. Barrier layer 148 can be an insulating layer of thick dielectric material such as aluminum oxide; a capacitance layer of thin dielectric material such as aluminum oxide; a nondissipative conducting layer such as indium tin oxide; or a layer with conducting energy bands or resonant quantum well tunneling at the low and ambient electron energy levels. The layers of the nonplanar reversible thermoelectric converter shown in FIG. 10 are evaporated on a glass substrate 150. The terminals of the reversible thermoelectric converter are terminal 152 for electrode 136, terminal 154 for electrode 138, terminal 156 for electrode 142 and terminal 158 for electrode 144.

In the nonplanar reversible thermoelectric converter of FIG. 10, electrode 136 can be a 100 angstrom evaporated copper film, barrier layer 140 can be a 12 angstrom evaporated aluminum oxide film, electrode 138 can be a 140 angstrom evaporated aluminum film, barrier layer 148 can be a 700 angstrom deposited indium tin oxide transparent conducting film, electrode 142 can be a 280 angstrom evaporated aluminum film, barrier layer 146 can be a 12 angstrom evaporated aluminum oxide film and electrode 144 can be a 140 angstrom evaporated copper film. Terminal 154 is typically connected to terminal 156. For this embodiment of the invention, 1 kilowatt of output power is available per square centimeter of active area of the quantum well diodes.

For both planar and nonplanar reversible thermoelectric converter circuits, it is understood that layers can be used over the top layer or under the bottom layer of the first diode in the reversible thermoelectric converter circuit for concentration, antireflection or trapping of incoming solar energy, or for the conduction of circuit current. The radiation resistant and heat resistant common metals used in the quantum wells of the reversible thermoelectric converter circuit permit a wide selection of additional layers as to shape, flexibility and texture. These options also include the use of minimum size solar concentrators, antireflection coatings and textured solar trapping cover glasses and substrates.

The transparent conduction layers can include conduction layers that can also function as antireflection coatings and trapping layers such as, for example, an indium tin oxide layer which can be added over the top electrodes of the first diode. Also, conduction and trapping layers can be added under the bottom electrodes of the first diode in the planar array of FIG. 9. When the conduction and trapping layer for the nonplanar array is under the bottom electrode of the first diode, the conduction layer functions as the barrier layer 148 shown in FIG. 10.

The conduction layers for trapping of incoming radiation of any wavelength and intensity can meet the widest range of applications and environments. In addition to the options for trapping, these options include options for maximizing the power conversion of a wide spectrum of intensities and wavelengths of incoming thermal radiation.

One of these options is adding pairs of electrodes over the top electrodes and under the bottom electrodes of the first diode of the planar or nonplanar array elements, where the added pairs of electrodes are connected in series and are spaced by transparent conduction layers to provide additional trapping path length. Each pair of electrodes has the required fixed increment of contact potential for the series array, and each pair has the required thickness of the quantum well for each electrode pair to provide the required absorption band.

For each application and environment, trapping layers can be added as a supplement or as an alternative to the conduction layers. One alternative or supplement is a textured substrate to increase the trapping path length, as described in the aforementioned article in *Solar Cells*. In this trapping option, the planar arrays are placed on the surface of a grating array which makes a steep angle with the incoming radiation so as to achieve the required multiple reflections with the required longer path length. The trapping path length of the incoming radiation is a function of the angle of the surface of the grating array.

Another alternative or supplementary option to supply an added trapping layer is disclosed in the aforementioned U.S. Pat. No. 4,004,210. Micrometer size curved reflecting surfaces are used to direct and focus incoming thermal radiation through micrometer size holes or slits to trap the radiation in a cavity between the trapping layer and the top electrode of the first diode in the planar array. For this option, the added path length of the trapped radiation is a function of the concentration level of the incoming thermal radiation that is obtained by the curved reflecting surfaces.

Any of the above options or combination of options for added layers can be added to the reversible thermoelectric converter circuit of the present invention. The requirements of the application and environment determine the options, if any, needed to achieve the maximum performance.

Figure 11:
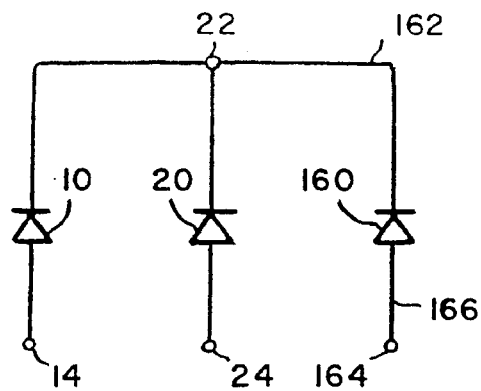
FIG. 11 is a schematic diagram of a two-stage reversible thermoelectric converter in accordance with the invention.

An important application of the reversible thermoelectric converter is as an electro-optical amplifier. One embodiment of this application is a two-stage amplifier in which a first stage serves to cool the input of a second stage as shown in FIG. 11. A reversible thermoelectric converter includes second stage quantum well diodes 10 and 20 as shown in FIG. 1. A cooling stage includes quantum well diode 160 connected in parallel with diode 20 at terminal 22 by conducting lead 162 and connected to terminal 164 by conducting lead 166. The performance equations for the two-stage reversible thermoelectric converter show that as the effective input temperature of diode 20 is lowered by the cooling stage, the gain of the second stage comprising diodes 10 and 20 is increased. The analysis shows a potential gain in power of up to 40 dB for the two-stage reversible thermoelectric converter as the input temperature of diode 20 is lowered to 60° K. The cooling stage, including diodes 20 and 160 in FIG. 11, enables the two-stage amplifier to amplify incoming energy that is below the noise level at room temperature.

The cooling stage also enables the amplifier circuit to obtain a 40 dB increase in the signal level so that signal levels below the noise level at room temperature can be amplified for signal levels and signal frequencies approaching that for an optical amplifier. To obtain this gain, a ratio of 100 must be maintained between the temperature of the hot electrons in diode 10 and the temperature of the cold electrons in diode 20. This ratio is obtained at a 60° K. temperature of cold electrons in diode 20 when the electrons in diode 10 are heated to a temperature of 6000° K. by applied electrical energy or by incoming visible thermal radiation. To maintain this temperature for diode 20, diode 160 and diode 20 are operated as a heat pump so as to cool diode 20. The heat pump acts as a refrigerator device for diode 20. A DC current is applied from terminal 24 through diode 20 and diode 160 to terminal 164. The power input to the refrigeration cycle is given in part by the product of the input DC current and the contact potential $V_c$ across diode 20. The other part of the power input to the refrigeration cycle is the heat energy input to diode 20 from the heat reservoir in thermal contact with diode 20. For a refrigeration cycle operating between the 300° K. temperature of diode 160 and the 60° K. temperature of diode 20, the coefficient of refrigeration performance for the reversible thermoelectric converter is given by 60° K./(300° K.−60° K.) so that for this operating range, the coefficient of refrigeration performance is ¼. The power input for the heat pump $P_{hp}$ is given by $P_{hp}=4P_h$, where $P_h$ is the heat power required to be removed from diode 20.

One important group of applications of the reversible thermoelectric converter of the present invention is for power conversion where the heat source is fossil fuel, nuclear, geothermal, waste heat, or any other fuel source. In this case, the temperature of the immediate environment can approach the maximum temperature generated by the fuel. In general, these applications are referred to as furnace applications. The physical environment is such that the reversible thermoelectric converter is located where the temperature is higher than room temperature $T_c=300°$ K., where $T_c$ is the temperature of the thermal reservoir for the cold diode 20. An example of the location of the reversible thermoelectric converter is in the wall of a furnace so as to intercept the maximum amount of thermal radiation at the highest temperature, and also to maintain a close thermal contact with the thermal reservoir for diode 20. The reversible thermoelectric converter is protected by a multilayer thermal conduction and convection shield comprised of closely-spaced thin film layers which are transparent to the incoming thermal radiation.

In the furnace application, the heat sources have temperatures in a range from 6000° K. down to temperatures below 400° K. The design of the quantum well diodes for each application must be in accordance with the design principles discussed above for different temperatures and intensity levels. The material and thickness of the electrodes of the quantum well diodes are selected to provide quantum level energy transitions for maximum oscillator strengths at the energy level of the incoming photons from the furnace.

The protective thermal barrier, if needed for protection from the environment, is a lightweight, thin film thermal barrier layer designed to serve as a protective layer against damage from the heat source. The thermal barrier is placed to enable the reversible thermoelectric converter to intercept the maximum amount of thermal energy at the highest temperature from the heat source and to approach the maximum efficiency of the highest temperature, while maintaining the temperature of the cold diode at $T_c=300°$ K. The protective shield intercepts negligible thermal heat on all exposed surfaces other than the active area of diode 10 by the use of such reflective materials as the reflective layers 120, 122 shown in FIG. 9.

In a first furnace embodiment, the reversible thermoelectric converter is used at the highest temperature potentially available from sources of thermal radiation, a solar furnace. A planar array, which can be fabricated in accordance with the above example for solar radiation, is coated with an oxide coating, such as aluminum oxide having a thickness of 500 angstroms, to protect the array for extended periods. For lower temperature ranges of 1000° K. to 2000° K., a thin transparent film such as quartz can be used for protection.

When the reversible thermoelectric converter is operated in an AC mode within a thermal barrier enclosure, such as a furnace environment as described above, each diode operates alternatively as a heat source and a heat sink for the other diode. Thus, a thermal reservoir is required for each diode. The transported thermal energy is the same for the power conversion cycle from diode 10 to diode 20 and for the heat pump cycle from diode 20 to diode 10. The same amount of heat is removed from the thermal reservoir of diode 20 during the heat pump cycle as the amount of energy that is added to the thermal reservoir during the power conversion cycle.

In order to provide high AC power output at low AC frequencies, a larger thermal reservoir than that provided by the electrodes of the quantum well diodes is required. The larger thermal reservoir can be metal layers contiguous to a potential barrier that is deposited on the electrodes of the quantum well diodes. These metal layers operate as a source and a sink for hot electrons in the heat pump cycle.

Figure 12:
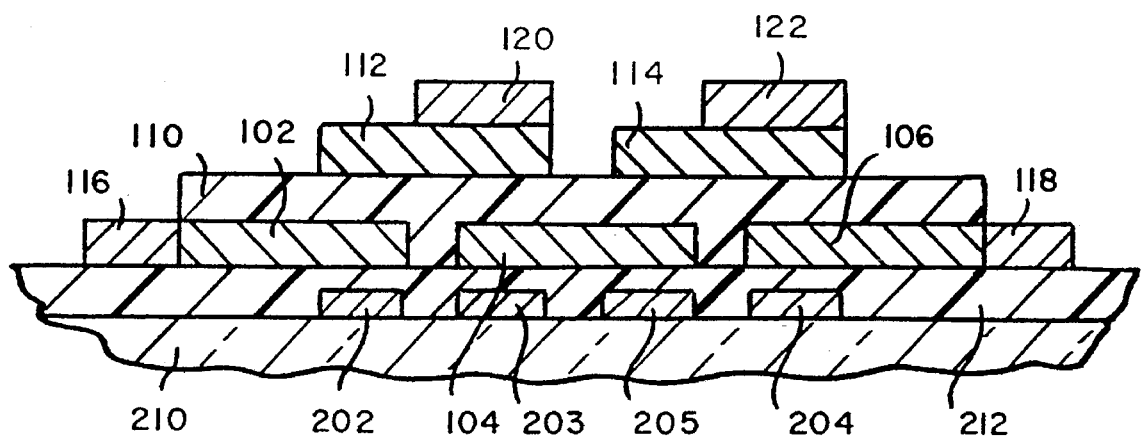
FIG. 12 is a cross sectional view of an array of reversible thermoelectric converters including metal layers which act as thermal reservoirs.

An embodiment of a planar array of reversible thermoelectric converters having thermal reservoirs for the power conversion process inside a thermally-insulated enclosure such as a furnace environment is shown in FIG. 12. Metal strips 202, 203, 204 and 205 are deposited on a substrate 210, which can be glass. The metal strips 202, 203, 204 and 205 can, for example, be aluminum having a thickness in the range of 100 angstroms to 10 micrometers. The substrate 210 is flexible and is supported in tension inside the thermal enclosure within the furnace to minimize heat loss by conduction. A potential barrier 212 is deposited over metal strips 202, 203, 204 and 205. The potential barrier 212 can, for example, be an aluminum oxide dielectric film having a thickness of 10 angstroms. The remaining elements of the planar array are fabricated on potential barrier 212. The remainder of the planar array, including aluminum electrodes 102, 104 and 106, aluminum oxide barrier layer 110, copper electrodes 112 and 114, terminals 116 and 118 and reflecting aluminum layers 120 and 122, has the same configuration described above in connection with FIG. 9.

The metal strips 202, 203, 204 and 205 are the thermal reservoirs for the respective diodes of the planar array. The potential barrier 212 allows the transfer of hot electrons to and from electrodes 102, 104 and 106. The volume and specific heat required for metal strips 202, 203, 204 and 205 for a specific application are determined from the power output and the AC frequency. From the frequency and the power output, the amount of heat stored during the heat cycle is determined. As the thickness of the metal strips 202, 203, 204 and 205 increases, the frequency of the AC power conversion can be decreased to the range of commercial AC transmission.

For AC operation within a thermal enclosure such as a furnace, some energy loss occurs during the fraction of the power conversion-heat pump cycle that is used for operation of the heat pump cycle. The energy loss and the options for reducing such loss are a function of the AC frequency and the power output in each furnace environment. At the highest AC conversion frequencies where the period of the AC conversion cycle and the circuit response time are less than the electron thermalization time, all incoming energy is converted into electric energy output during each AC period before any loss from electron thermalization occurs. Therefore, the maximum use of available energy in the furnace environment is achieved.

The same result can be obtained for lower AC frequencies by reducing the fraction of the period of the AC conversion cycle required for the heat pump cycle. By scaling the dimensions of the electrodes or the current collection grid of the quantum well diodes in an array of reversible thermoelectric converters, the current capacity of the reversible thermoelectric converter circuit can be increased by the amount needed to transport the thermal energy from diode 20 during a short heat pump cycle needed to maintain the temperature of diode 20 at the level of the outside cool reservoir. Alternatively, mechanical, optical or electro-optical techniques can be used to block absorption of the incoming thermal radiation from the reversible thermoelectric converter during the brief intervals required for the heat pump cycle to remove thermal energy from diode 20.

The available location within the furnace determines the size and shape of the power conversion reversible thermoelectric converter array. In one embodiment, two thin, lightweight, flat arrays are supported in tension, back-to-back by a thin supporting frame of a heat resistant material such as tungsten. One array performs power conversion, and the other array acts as a heat pump. The reversible thermoelectric converter arrays are protected within a thermal enclosure such that the temperature of the array approaches the maximum temperature of the source while the arrays are thermally protected against unusable convection heat by transparent, closely-spaced thin films in front of the active areas of the quantum well diodes. The arrays are also thermally protected against unusable wavelengths of incoming thermal radiation using a thin layer that is closely spaced in front of the active areas of the quantum well diodes. The thin layer can be covered with a radiation absorbing metal film to convert the unusable wavelength of thermal radiation into a usable wavelength.

Figure 13:
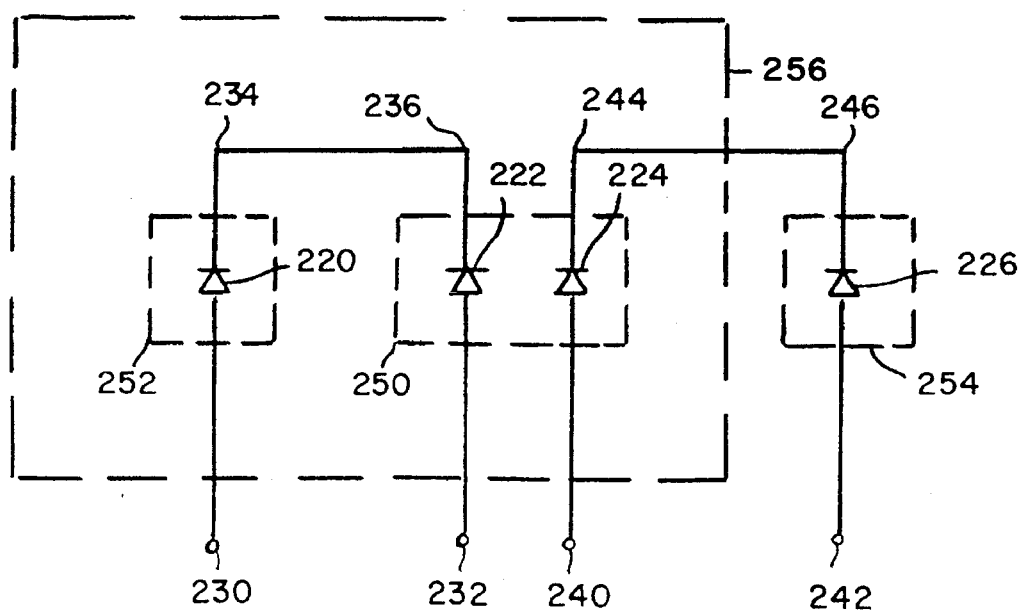
FIG. 13 is a schematic diagram of a two-stage reversible thermoelectric converter including separate circuits for power conversion and heat pump functions.

A schematic diagram of a two-stage reversible thermoelectric converter suitable for use in a furnace environment is shown in FIG. 13. It will be understood that each reversible thermoelectric converter is typically implemented as a planar array as described above. A reversible thermoelectric converter comprising diodes 220 and 222 performs the power conversion function, and a reversible thermoelectric converter comprising diodes 224 and 226 performs the heat pump function. Diodes 220 and 222 are connected to output terminals 230 and 232, respectively, and are connected to each other via terminals 234 and 236. Diodes 224 and 226 are connected to output terminals 240 and 242, respectively, and are connected to each other via terminals 244 and 246. Power conversion terminals 230 and 232 provide output power as described above. A DC source is connected to terminals 240 and 242 to reverse the normal direction of current flow through diodes 224 and 226. Diodes 222 and 224 are enclosed in a quasi-static heat reservoir 250 at a temperature $T_o$, diode 220 is enclosed in a quasi-static heat reservoir 252, and diode 226 is enclosed in a quasi-static heat reservoir 254. Diodes 220, 222 and 224 together with heat reservoirs 250 and 252 are enclosed within a quasi-static heat reservoir 256.

The heat reservoir 256 is the thermally-insulated enclosure formed by thermal barriers and thermal shields inside the furnace. The volume within the thermally-insulated enclosure acts as a quasi-static heat reservoir for operation of the power conversion cycle of the reversible thermoelectric converter within the furnace. The wavelengths of incident thermal radiation absorbed by diode 220 are the only significant incoming or outgoing thermal heat to the interior of the heat reservoir 256. Within the heat reservoir 256, heat reservoir 252 operates as a heat reservoir for diode 220 during the power conversion cycle. Heat reservoir 250 operates as a heat reservoir for diodes 220 and 224 during the power conversion and heat pump cycles. Heat reservoir 254, which is at the cool temperature of the output power for the power conversion-heat pump cycle, operates at the output temperature $T_c$. The output temperature $T_c$ of diode 226 and the temperature $T_r$ of the heat source for the incoming radiation determine the power conversion efficiency for the power conversion cycle.

In the furnace applications of the reversible thermoelectric converter, resistive losses in the connecting leads can be significant. In order to minimize such losses, it is desirable to minimize the length of conducting leads and to maximize the voltage generated by the reversible thermoelectric converter. The contact potential $V_c$ of the quantum well diode is a function of the different work functions of the materials used in the electrodes. The output voltage of the reversible thermoelectric converter can be increased as shown in FIGS. 9, 9A, 9B, 9C and 9D and described above.

Figure 14:
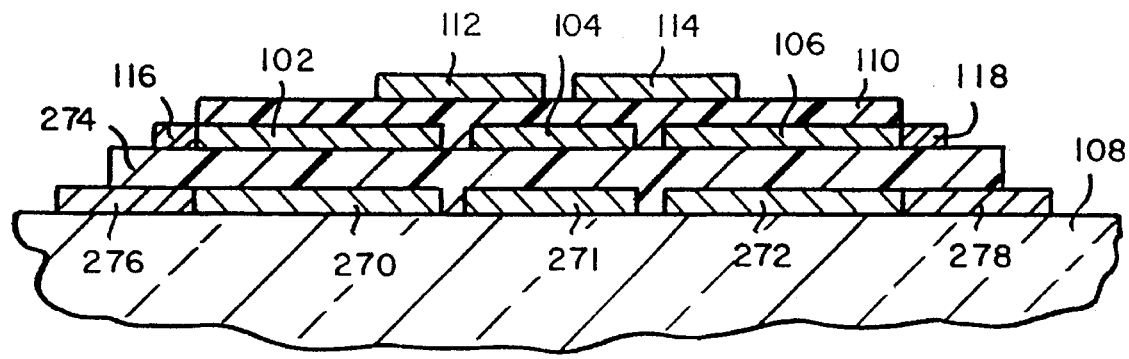
FIG. 14 is a cross sectional view of a planar array of reversible thermoelectric converter devices, including means for applying increments of voltage to the devices of the array.
Figure 14A:
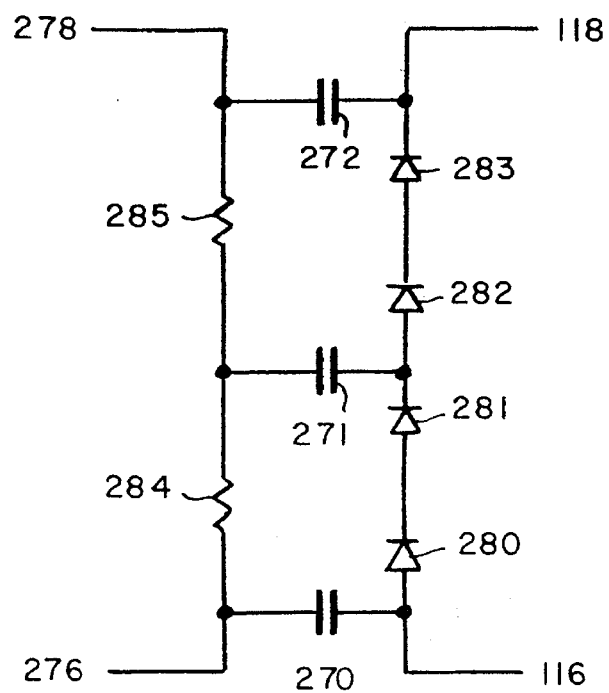
FIG. 14A is a schematic diagram of the planar array of FIG. 14.

A series array of quantum well diodes having voltage increments added by an applied electric field is shown in FIG. 14. An equivalent circuit diagram is shown in FIG. 14A. The configuration shown in FIGS. 14 and 14A corresponds to one of the multiple electrode diodes 123 or 128 shown in FIG. 9B and described above.

Auxiliary electrodes 270, 271 and 272 are deposited on glass substrate 108. A terminal 276 is in electrical contact with electrode 270, and a terminal 278 is in electrical contact with electrode 272. The auxiliary electrodes 270, 271 and 272 and terminals 276 and 278 can be an aluminum film 200 angstroms thick. The planar array including electrodes 102, 104, 106, 112 and 114, dielectric layer 110 and terminals 116 and 118, as described above in connection with FIG. 9, is positioned over electrodes 270, 271 and 272. The planar array is separated from electrodes 270, 271, 272 by an insulating layer 274, which can be an aluminum oxide layer having a thickness of 500 angstroms. The electrodes 102, 104 and 106 are aligned with electrodes 270, 271 and 272, respectively and preferably have the same dimensions.

A schematic diagram of the planar array of FIG. 14 is shown in FIG. 14A. As discussed previously in connection with FIG. 9, electrodes 102, 104, 106, 112 and 114 define series-connected diodes 280, 281, 282 and 283. A high impedance resistor 284 is connected between electrodes 271 and 270, and a high impedance resistor 285 is connected between electrodes 271 and 272. A voltage applied between terminals 278 and 276 results in successively larger voltages applied to electrodes 270, 271 and 272. Thus, equal increments of electric field are applied to diodes 280–283. The electrodes 102, 104, 106, 112 and 114 are typically of the same metal, such as copper. The configuration shown in FIGS. 14 and 14A represents one multiple electrode diode of a reversible thermoelectric converter, such as diode 10 in FIG. 1. A similar configuration is used for the second multiple electrode diode of the reversible thermoelectric converter. Two multiple electrode diodes as shown in FIGS. 14 and 14A can be used to form an array element of a reversible thermoelectric converter. The array elements can be connected in series as shown in FIG. 9A to obtain an increased output voltage.

For applications where there is a requirement for time-varying voltage increments that are added by an applied electric field, the time constant of the RC circuit of the auxiliary electrodes shown in FIGS. 14 and 14A can be varied to meet this requirement. As an alternative to a discrete component circuit, a high impedance resistive film connected to terminals 276 and 278 can be used to replace the auxiliary electrodes 270, 271 and 272 shown in FIG. 14 and the high impedance resistors 284 and 285 shown in FIG. 14A. The capacitance between each localized region of the resistive film and the series planar array applies the electric field to add the voltage increments when a voltage is applied between terminals 276 and 278.

To permit the resistive film RC circuit or the discrete component RC circuit of FIG. 14 to be used as one of the layers in the protective, trapping or antireflection layers on the top of a series planar array, an insulating transparent protective layer such as aluminum oxide is deposited over the planar array. A transparent resistive film or a transparent discrete RC circuit is deposited over the transparent protective layer. The terminals for the transparent resistive film or the transparent discrete component RC circuit are located adjacent to terminals 116 and 118 and over electrodes 102 and 106, respectively.

In a second option having the lowest RC time constant using a capacitance circuit, the voltage increments are obtained by an applied electric field which adds a voltage increment to each electrode pair that is inversely proportional to the capacitance across each quantum well electrode pair. In the second option of the series planar array, the auxiliary electrodes 270 and 272 and the terminals 276 and 278 are used. The voltage applied between terminals 276 and 278 is capacitively coupled by auxiliary electrodes 270 and 272 to electrodes 102 and 106, respectively, of the planar array.

In the second option, with the auxiliary electrodes on either the top layer or the bottom layer of the planar array, the response time to the voltage that is applied between terminals 276 and 278 can be as short as the response time of the reversible thermoelectric converter of the present invention. The time constant of each option of the series planar array is given by the product of the total series resistance times the total series capacitance of the n pairs of electrodes connected in series. The time constant is independent of the number of array elements in the series planar array, since the series resistance increases in proportion to the number of pairs of electrodes, and the series capacitance decreases in proportion to the number of pairs of electrodes. The time constant for the planar array circuit therefore reduces to the conversion time $t_c$ for the reversible thermoelectric converter as given by Equation (5), so that the value of $t_c$ can be maintained at a value less than $10^{-12}$ seconds.

In the second option, the n pairs of electrodes, each pair with a capacitance C, are connected in series to terminals 276 and 278 with a capacitance $C_0$ between auxiliary electrodes 270 and 272 and electrodes 102 and 106, respectively, as shown in FIG. 14. The total sum of the voltage increments added to the pairs of electrodes is given by the ratio $C_0/(C_0+C/n)$ times the voltage applied between terminals 276 and 278. As a result of the fast response time with maximum efficiency, together with the ultra light weight of the planar arrays, the second option is preferred for the power conversion of solar energy in space for applications such as the amplification and broadcasting of high frequency power output for high definition television (HDTV) or for directed beams of output solar power or environmental data using radio waves.

In the second option, as well as in all embodiments for adding varying voltage increments to the series arrays of reversible thermoelectric converters, when the electrodes of the series planar array are made of the same metal, with the same Fermi level and the same work function, the polarity of the contact potential $V_c$ is reversed when the applied electric field is reversed, resulting in a reversal of the output voltage $V_0$. Thus, an AC output voltage can be obtained, using any of the embodiments for adding varying increments of voltage to a series array, by a periodic reversal of the voltage applied to terminals 276 and 278.

For applications of the second option to high frequency output power or signals, two series arrays as shown in FIGS. 14 and 14A are connected as shown in FIG. 1 to form an array element of a reversible thermoelectric converter. AC voltage inputs of opposite polarity at the required output frequency are applied to the terminals 276 and 278 of the two series arrays. The maximum amplitude of the AC voltage input to terminals 276 and 278 for the two series arrays is given by Equation (5) as the maximum value of $V_0$ for which the conversion time is less than the electron thermalization time.

For applications of the second option to amplifying incoming signals, a DC voltage is applied between terminals 276 and 278. The DC voltage meets the same condition for the maximum value given by Equation (5) for $V_0$ for the amplified output voltage of the maximum incoming signal. The DC voltage is used as the applied input voltage to terminals 276 and 278 of the first and second multiple electrode diodes of a reversible thermoelectric converter. The incoming AC signal is applied to terminals 276 and 278 of the cold first multiple electrode diode at temperature $T_c$. The solar energy is incident on the hot second multiple electrode diode at temperature $T_r$.

For an extended series and parallel connection of reversible thermoelectric converter array elements, each comprised of first and second multiple electrode diodes as shown in FIGS. 14 and 14A, a desired output voltage can be obtained from the series connection of array elements and a desired output current can be obtained from the parallel connection of array elements. For an extended array in which the intensity and temperature of the input thermal energy are varying with time over the area of the total planar array, the voltage applied to each section of the array can be varied as required to achieve optimum performance for each section of the array.

Also, optimum performance can be achieved for each section of the planar array using variable applied voltage to control the contact potential in the planar array structure of FIG. 9. A transparent auxiliary electrode is affixed to the top of the planar array, and an auxiliary electrode is affixed to the bottom of the planar array shown in FIG. 9. In this configuration, the reflecting layers 120 and 122 and the electrodes are fabricated of the same metal, and the contact potential of the array element corresponds to the voltage applied between the auxiliary electrodes.

For each section of an array using planar arrays as shown in FIGS. 14 and 14A and described above, the application of a varying voltage between the terminals 276 and 278 permits the total contact potential of n pairs of electrodes to be varied in proportion to the applied voltage. Also, for each section of an array using the planar array structure shown in FIG. 9 in which the work function of each electrode is the same, the application of a varying voltage between auxiliary electrodes above and below the planar array permits the contact potential for each diode of the array section to be varied in proportion to the applied voltage.

For all of the array embodiments using electrodes fabricated of the same metal, AC output power can be obtained without storing thermal energy during the AC cycle.

The variable contact potential options described above are in addition to the fixed contact potential options, such as obtained by the use of implanted ions or metal alloys. The fixed increments of contact potential are used for applications that do not require variable applied contact potential. Examples of applications of variable applied contact potential are to vary the contact potential $V_c$ as a function of varying temperature and/or intensity of the input thermal energy, or to vary the contact potential $V_c$ to obtain AC output power without storing thermal energy during the AC cycle.

In the furnace application, the cool diode of the reversible thermoelectric converter can be separated from the hot diode, so that the hot diode is located on the inside surface of the furnace wall and the cool diode is located outside the furnace in thermal contact with the cold heat reservoir. This separation is achieved by increasing the voltage to current ratio of the series array as described above. For example, with reference to FIG. 13, where diodes 224 and 226 remove power conversion heat loss from diode 222, diode 226 can be removed from the furnace environment to a cold reservoir. In a similar manner, diodes 222 and 226 can be removed from the furnace environment, and diode 224 can be placed in close thermal contact with diode 220 so as to operate either in a power conversion-heat pump cycle or in a dual thermal band power conversion cycle. This configuration is used for obtaining maximum efficiency and/or the maximum power output for the power conversion cycle. Operating in the heat pump cycle, the diode 224 improves power conversion performance by lowering the temperature of diode 220. Operating in the dual thermal band power conversion cycle, diode 224 improves power conversion performance by increasing available power output for a second lower temperature band of incoming heat through heat reservoir 256. For the dual thermal band power conversions cycle, diode 220, which converts the high temperature heat band, uses series array electrodes of high temperature metals such as tungsten to intercept all the incoming thermal radiation in the high temperature band. Diode 224, which converts the lower temperature band, is in close thermal contact with diode 220 and uses a series planar array of electrodes designed for the lower temperature range. Diode 224 can also include thermal reservoirs for the power conversion process, corresponding to metal strips 202–205 in FIG. 12, and has a series planar array of electrodes for adding voltage increments corresponding to that shown, for example, in FIG. 14. The use of thermal reservoirs allows the reversible transfer of hot electrons to and from the electrodes of diode 220 and the electrodes of diode 224. The ability to vary voltage increments applied to the series array, corresponding to that shown in FIG. 14, permits the performance of the two-stage reversible thermoelectric converter for a power conversion-heat pump cycle or for a dual thermal band power conversion cycle to be optimized. The option to generate AC output power can be used in the furnace environment for transmission of conversion energy outside the furnace environment, using either thermally insulated conducting leads or capacitive coupling of the conversion energy between heat reservoirs.

The planar array of reversible thermoelectric converters of the present invention can be utilized in a lightweight, highly efficient space module array for solar energy conversion or as an amplifier. For the space environment, no thermal insulation of the space module array is required, except for the nonactive surfaces that are exposed to direct sunlight. The absorption of solar energy by the nonactive surfaces is minimized by a reflective surface coating such as aluminum. The low temperature space environment enables the power conversion-heat pump thermodynamic cycle for the reversible thermoelectric converter to be operated near maximum efficiency. The incident solar energy that is absorbed by the nonactive area of the array is very small, and the power loss due to the incremental change in temperature is not a significant factor in the power output. Planar arrays of reversible thermoelectric converters with a thin film construction can be supported with a lightweight structure and can be unfurled in space. The ultra light weight of the space module array is evident from the fact that the weight of a 100 square meter space array, including supporting booms, can be as little as 10 kilograms, as described by J. C. Yater in *Applied Optics*, February 1975, pages 526–536, in connection with supporting a film of similar size in synchronous orbit. The three millimeter diameter quartz booms supporting one square meter panels of arrays have a bending moment well below the critical bending moment. At this diameter, the ratio of boom weight to array weight is small. The space support structure for the thin film planar arrays can be several orders of magnitude lighter than the support structure for a comparable thin film planar array on Earth. For a space structure using 100 rows of 100 panels, each of one square meter, the total power can be larger than 10 megawatts. The weight of the square space array can be as little as 20 kilograms, not including the weight required for interconnection as a power relay of solar energy or as a power source for signal relay of digital high definition TV signals.

A second embodiment of the space module uses a two-stage reversible thermoelectric converter as shown in FIG. 13, which can operate reversibly using little or no concentration of solar energy. In this case, the space module comprises three submicrometer thick substrates supported in tension by millimeter diameter booms. The first substrate supports the series array first diode corresponding to diode 220 in FIG. 13. The second substrate is in thermal contact with the first substrate and supports both the series array second diode corresponding to diode 222 in FIG. 13 and the cold series array first diode of the heat pump corresponding to diode 224 in FIG. 13.

The third substrate is not in thermal contact with the second substrate and supports the series array second diode of the heat pump cycle corresponding to diode 226 in FIG. 13. The inner surface of the third substrate has a thermally reflective layer adjacent to the second substrate and has a thermally emissive layer on the outer surface so as to operate as the heat reservoir for the series array second diode of the heat pump cycle.

Using DC power from the power conversion cycle, the heat pump cycle operates between the cryogenic temperature of the second substrate and the temperature of the third substrate of approximately 160° K. The Carnot efficiency limit for this power conversion-heat pump cycle of the intercepted solar energy is 97%. The operation of the reversible power conversion-heat pump cycle using components at cryogenic temperatures minimizes heat losses, including transmission losses of the output power.

Either of the power conversion space modules described above can be used by attaching the power conversion space module to the two-stage amplifier shown in FIG. 11 for operation in a combined power conversion-amplifier cycle to broadcast radio waves, such as HDTV signals. Preferably, the two-stage space module corresponding to FIG. 13 is used. Signals received by a dipole filament array antenna are applied between terminals 22 and 24 of diode 20 of the two-stage amplifier shown in FIG. 11. The received radio wave signals are amplified using solar energy input to heat the electrons in diode 10 to a temperature of 6000° K. Also, the input DC power from the two-stage space module output terminals, corresponding to terminals 230 and 232 in FIG. 13, is applied to terminals 24 and 164 of the two-stage amplifier shown in FIG. 11 to cool diode 20.

The amplified received signal at output terminals 14 and 24 of the two-stage amplifier shown in FIG. 11 is applied between terminals corresponding to terminals 276 and 278 of the series array first diode shown in FIG. 14, wherein the planar array first diode corresponding to diode 220 in FIG. 13 is implemented as shown in FIG. 14. Also, an amplified received signal of equal amplitude and opposite polarity is applied between the terminals corresponding to terminals 276 and 278 of a separate planar array second diode, also implemented as shown in FIG. 14. The planar array second diode corresponding to diode 222 in FIG. 13 is implemented as shown in FIG. 14. The applied signal modulates the AC waveform of the space module output power delivered between output terminals corresponding to output terminals 230 and 232 in FIG. 13. The output power is delivered to a transmitting antenna, such as a dipole filament array antenna. The transmitted signal can be the combined power output of an array of one square meter space modules.

Figure 15:
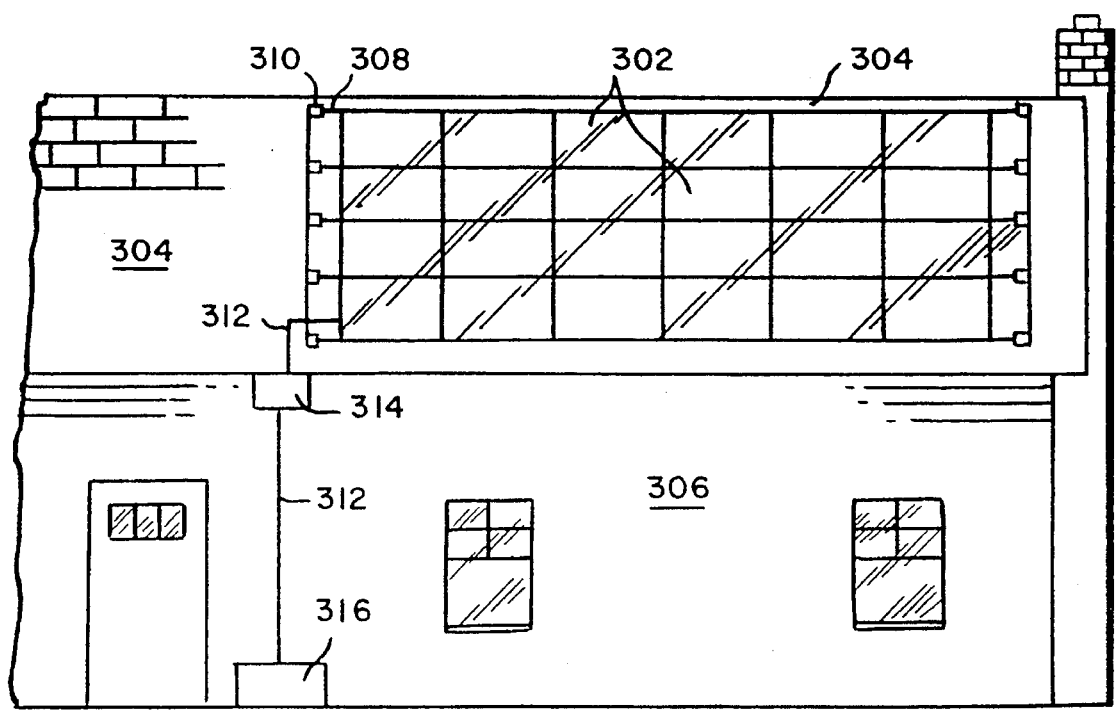
FIG. 15 is a pictorial diagram of an array of reversible thermoelectric converter panels mounted on the roof of a home.

An application of the reversible thermoelectric converter of the present invention for power conversion and heat pump cycles is shown in FIG. 15. Panels 302, each comprising planar arrays of reversible thermoelectric converters with a series/parallel configuration as described above, are mounted on a roof 304 of a home 306. The panels 302 are mounted by steel wires 308 connected to brackets 310 attached to roof 304. A power output cable 312 is connected to a distribution box 314 and to a power storage means 316. Each panel 302 contains a power conversion-heat pump module comprising planar arrays of reversible thermoelectric converter circuits. The output voltage is 120 volts, and the maximum power output is on the order of several hundred watts. The only additional items required for the operation of the power conversion-heat pump cycle shown in FIG. 15 are an AC signal control and a DC signal control connected in series with the output of the panel array. The AC signal control delivers the power required to reverse the output current direction. The AC and DC controls allocate a portion or all of the power to DC power such as for storage of DC power.

The planar array and the power conversion-heat pump cycles of the reversible thermoelectric converter of the present invention have applications for the energy needs of the home. In one option, the planar arrays mounted in panels on the home roof as shown in FIG. 13 can comprise only the first diode (diode 10, FIG. 1) of the reversible thermoelectric converter. The planar array second diode (diode 20, FIG. 1) is placed in a separate location to enable the power conversion heat loss to be directed inside the home when needed for heat or to be directed outside the home when not needed for heat. When the first and second diodes are separated, the AC needs of the home can be obtained by operating with AC power output, without storing heat energy during the AC cycle. When there is no solar energy input, the roof first diodes and the second diodes can be operated in the heat pump cycle for air conditioning in warm weather, or as a heat pump in cold weather.

The two-stage reversible thermoelectric converter shown in FIG. 13 and described above can be used in the home configuration. The heat pump function is performed by diode 224 in FIG. 13 operating in thermal contact with the second diode of the home roof configuration. The diode corresponding to diode 224 is positioned to transport thermal energy to the inside of the home. The two-stage reversible thermoelectric converter can also be operated to cool the second diode of the home roof power conversion configuration to the low temperature that is required in the power conversion-heat pump cycle. The two-stage reversible thermoelectric converter can also be used to help maintain power conversion as the solar intensity decreases.

Figure 16A:
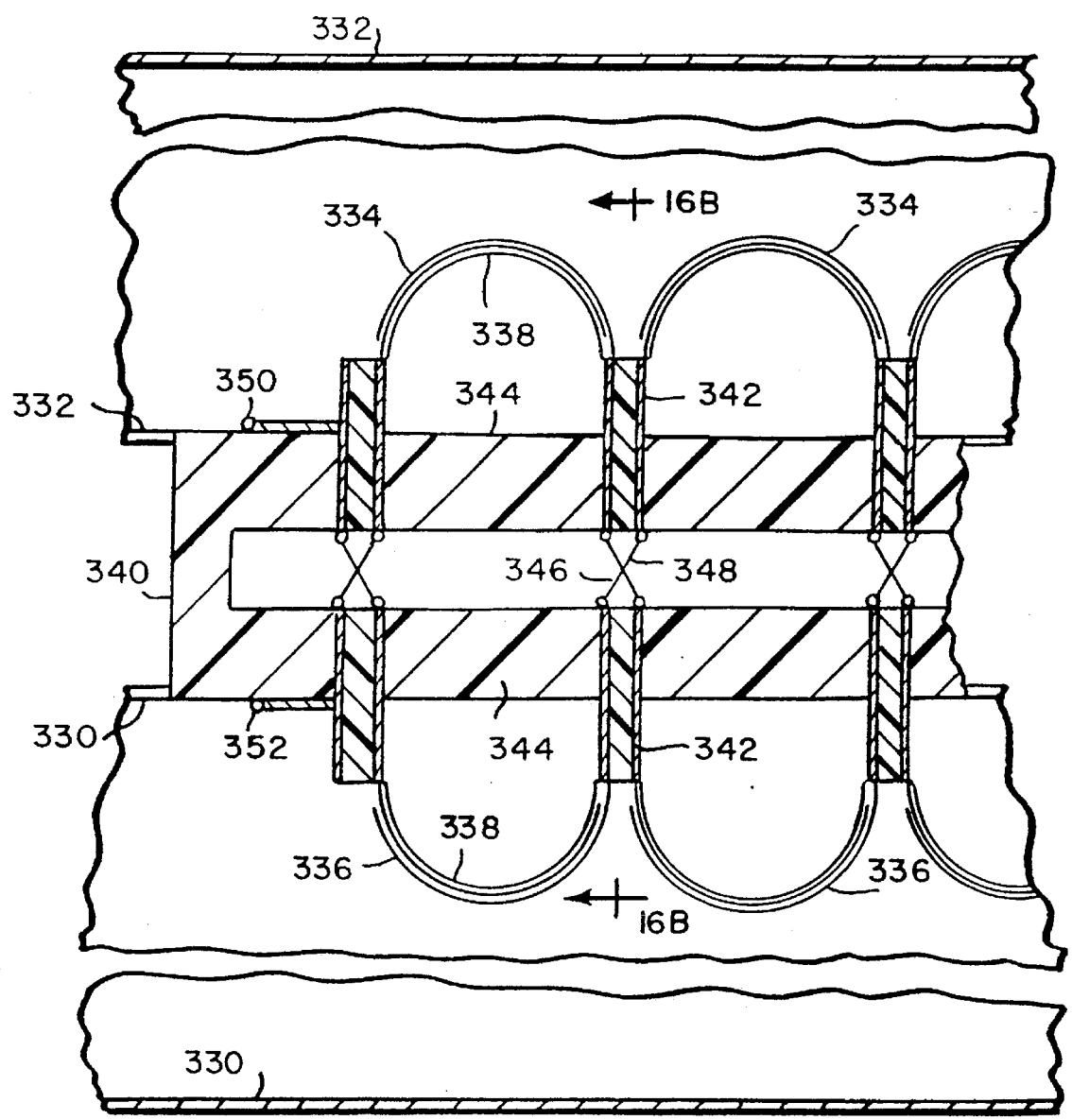
FIG. 16A is a cross sectional view of a heat pump assembly of reversible thermoelectric converters mounted in heating and air conditioning ducts.
Figure 16B:
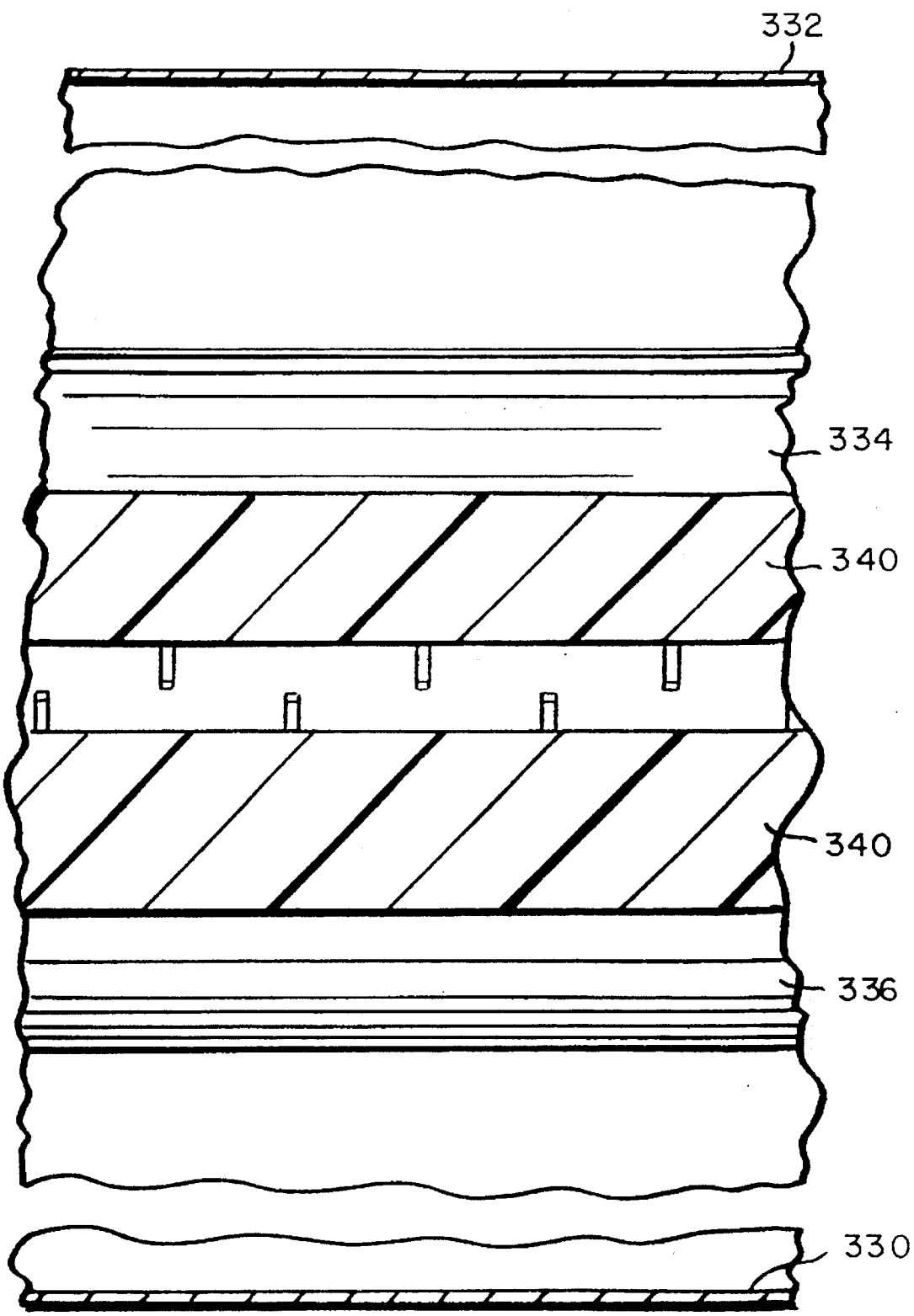
FIG. 16B is a cross section of the heat pump assembly taken along the line 16B—16B of FIG. 16A.

An application of the reversible thermoelectric converter of the present invention in heating and air conditioning ducts is shown in FIGS. 16A and 16B. Insulated ducts 330 and 332 run side-by-side with one duct carrying heated air and the other duct carrying cooled air. Openings are formed in ducts 330 and 332, and a reversible thermoelectric converter assembly is mounted between the ducts. Quantum well diode arrays 334 are mounted within duct 332, and quantum well diode arrays 336 are mounted within duct 330. Diode array 334 corresponds to diode 10 in FIG. 1, and diode array 336 corresponds to diode 20. The diode arrays are fabricated on substrates 338 which can be flexible films of glass or quartz. The diode arrays 334 and 336 are mounted in slots in a plastic or ceramic support frame 340 positioned between air ducts 330 and 332. The diode arrays 334 and 336 are clamped in position by metal contacts 342 attached to support frame 340. Outer surfaces 344 of support frame 340 facing air ducts 330 and 332 are coated with a thermal reflector such as aluminum. Diode arrays 334 and 336 are connected in series by conducting leads 346 and 348 in the configuration shown in FIG. 1 and are connected to output terminals 350 and 352.

For the reversible thermoelectric converter of the invention operating in the heat pump cycle, the first and second diodes can comprise n pairs of electrodes as described above in connection with FIGS. 9–9D, 14 and 14A. The ability to operate at low heat intensity and low temperatures, the ability to separate the first and second diodes of the heat pump, and the ability to utilize the various array configurations described above can be applied to the heat pump configurations.

The heat pump configuration can be utilized in automobiles. In this case, a series array first diode is mounted in the upholstery of the seats and/or the ceiling of the automobile, and the series array second diode is placed in an area of the automobile exposed to the outside air. This configuration can be used to heat or cool the automobile efficiently.

The configuration shown in FIGS. 16A and 16B can also be utilized in the power conversion of thermal energy in a high temperature or furnace environment. For this application, the required number of pairs of electrodes for the diode array 334 and the required number of pairs of electrodes for the diode array 336 are selected to permit separation of diode arrays 334 and 336, while minimizing the dissipative thermal conduction loss. Insulated duct 332 carries unheated gas inside the transparent wall of duct 332 facing diode array 334. The walls of duct 332 can be of quartz film spaced from diode array 334 to permit air flow for cooling of the transparent film and diode array 334. The duct 330 is a rigid non-transparent duct carrying cooled gas or cooled liquid for removing power conversion heat loss so as to maintain a cool temperature of the diode array 336. Either AC or DC operation can be utilized. The AC output can be transported over longer distances by using step-up transformers at the output of terminals 350 and 352.

When cooling gas flow is not utilized in duct 332, the diode array 334 can be constructed of high temperature material, such as tungsten for the metal electrodes and aluminum oxide for the substrate. For operation between the temperature of the source of incoming radiation and the cold temperature of diode array 336, there are no dissipative heat losses in diode array 334.

The rate of incoming heat conduction to diode array 334 can be minimized by using spaced layers of quartz material for the transparent wall of duct 332 facing diode array 334. The equilibrium temperature of the crystal lattice in diode array 334 is thereby minimized so that a moderate temperature is maintained. The equilibrium temperature depends on thermal equilibrium for the radiation of the metal electrode crystal lattice in the direction back to the heat source being equal to the heat conduction through the transparent wall of duct 332 facing diode array 334. An increase in the voltage to current ratio by increasing the number n of electrode pairs in diode array 334 enables the heat loss by thermal conduction through conducting leads 346 and 348 to be minimized. To further decrease and minimize heat conduction loss through conducting leads 346 and 348, the power conversion output can be a high frequency AC power output that is transmitted through capacitors that replace conducting leads 346 and 348.

The configuration shown in FIGS. 16A and 16B can be used in a variety of furnace and high temperature environments including spatially distributed heat sources and heat sources that vary in temperature and intensity. For example, in the power conversion application where cooling gas flow is not used and where the maximum power output is required for a high temperature turbulent environment with varying temperature bands, a two-stage reversible thermoelectric converter can be used to provide increased output by utilizing a power conversion-heat pump process or by utilizing a dual thermal band power conversion cycle.

A two-stage reversible thermoelectric converter as shown in FIG. 13 can be used for high capacity output when mounted on substrates 338 in FIG. 16A. For high capacity use, diode array 334, which corresponds to diode 220 in FIG. 13, is placed on top of diode 224 of FIG. 13. Diode 224 is mounted on substrate 338 and in close thermal contact with diode 334. Diode 336, which corresponds to diode 222 of FIG. 13, is placed on top of diode 226. Diode 226 is mounted on substrate 338 and in close thermal contact with diode array 336.

The planar arrays of the two-stage configuration as applied to FIG. 16A can utilize the diode array shown in FIG. 14. The terminals 276 and 278 in the array of FIG. 14 are used for applying an external electric field to add incremental increase in contact potential for successive pairs of electrodes. The terminals 116 and 118 of the planar array of FIG. 14 correspond to terminals 350 and 352 in FIG. 16A. In the two-stage reversible thermoelectric converter, conducting leads 350 and 352 are replaced with multiple leads including conducting leads for each of the diodes and conducting leads for applying an external electric field to each of the array elements.

In the two-stage reversible thermoelectric converter, the diode arrays corresponding to diodes 224 and 226 in FIG. 13 are operated in the heat pump cycle to remove the small incoming leakage heat so as to achieve maximum conversion efficiency from diode arrays 334 and 336. When the incoming heat is at a lower temperature, the diode array 224 of FIG. 13 is operated in a lower temperature power conversion cycle. The dual ranges for the temperature and power outputs are obtained by controlling the contact potential $V_c$ and the output voltage so as to maximize the power output. For both power conversion cycles, an AC output can be used to supplement the power output from inside the furnace environment so as to minimize thermal conduction losses.

In summary, the physical basis for the reversible process of the reversible thermoelectric conversion invention is that the conversion time of the thermal energy of the incoming hot electrons is smaller than the thermalization time $t_{ep}$ for the hot electrons. This result is achieved by limiting the storage time for the electromagnetic energy in the energy levels of the quantum well electrodes so as to thereby limit the conversion time.

This is achieved by reducing the level of the voltage input $V_{ii}$, generated by the conversion of the thermal energy input of the hot electrons, by limiting the contact potential $V_{ci}$ for the quantum well electrodes. The limit for $V_{ci}$ is a function of the incoming power rate, the capacitance between the quantum well electrodes, the ratio of the temperature of the hot electrons to the temperature of the cold electrons, and the thermalization time of the hot electrons.

The physical basis of the reversible process of the reversible thermoelectric conversion invention which enables the first diode to be separated from the second diode of the conversion circuit by the distance required for each application and environment is that each first diode and each second diode can be comprised of a series array of pairs of electrodes as shown in FIG. 9B. For this series array, the contact potential between each pair of electrodes can be added in series with the series sum the same for the resultant contact potential for the first diode and the second diode. The resultant contact potentials $V_c$ for the series array of pairs of electrodes in the reversible thermoelectric conversion circuit can be increased so as to give the voltage output $V_o$ which is required to transport the conversion energy from the first diode over the required separation distance to the second diode.

Examples of the options for adding the increments of contact potential $V_{ci}$ to the series array of electrode pairs are given above for both fixed increments and variable increments of voltage. For each option, as shown in the energy level diagram of FIG. 9C, the Fermi levels become equal for the equilibrium state after contact is made between all pairs of electrodes for the reversible thermoelectric circuit. After the equilibrium state shown in FIG. 9C is established for the typical ultrafast conversion circuit, it can be seen from FIG. 9C that the pairs of electrodes represented by E1 to E4 and E6 to E9 are equivalent electrically to two diodes. These two equivalent diodes are able to function as one first diode and one second diode with each diode having an effective contact potential $V_c$ equal to the sum of the contact potentials $V_{ci}$ of these 4 pairs of electrodes. As a result, by increasing the number n of pairs of electrodes in series for the first diode and the second diode as required to achieve the required output voltage, the separation distance between the first diode and the second diode can be increased to meet the requirements of all the major applications.

The performance output of the reversible thermoelectric conversion circuit is a function of the resultant contact potentials $V_c$ of the sum of the contact potentials of the series array whereas, the conversion time for each incoming hot electron input is a function of the contact potential $V_{ci}$ of only one pair of quantum well electrodes in the series array for the first diode. As a result, both the conversion time and the output voltage of the reversible thermoelectric conversion circuit can be achieved independently so as to meet the requirements for each of the major applications.

The physical basis of the reversible process of the reversible thermoelectric conversion invention which enables an applied electric field to add a variable contact potential in series between each pair of electrodes in the series array of pairs of electrodes is comprised of two combined reversible processes. In one of the reversible processes, the energy of the resultant electrostatic field between the pairs of electrodes is minimized and, in the second of the reversible processes, the equilibrium for the chemical potential of the reversible thermoelectric conversion circuit is established.

In the first of the reversible processes, the electric field is applied by auxiliary electrodes and the energy of the electrostatic field between the pairs of electrodes is minimized, in accordance with Thompson's Theoren, by the separate distribution of charges on the surface of each auxiliary electrode and each pair of quantum well electrodes. This charge distribution occurs within the minimum response time for the capacitance of each electrode pair and generates the contact potential $V_{ci}$ for each electrode pair that is inversely proportional to the capacitance of each electrode pair. Each contact potential $V_{ci}$ represents the added positive or negative voltage to each electrode that increases or decreases the voltage potential level of each succeeding electrode pair in the applied electric field.

The second of the combined reversible processes establishes the equilibrium for the chemical potential of the Fermi Dirac distribution in the reversible thermoelectric conversion circuit and also in the ultrafast time for a typical application. Equilibrium for the chemical potential, which, for the Fermi Dirac distribution, is equal to the Fermi energy, gives the result that the Fermi level has a constant value for all Fermi conductors in the reversible thermoelectric conversion circuit so that the levels must be equal for all pairs of quantum well electrodes that are in contact.

The energy level diagram for the final result of these two combined reversible processes is shown in FIG. 9C. As shown, the first reversible process establishes the contact potential $V_{ci}$ of these 8 pairs of electrodes for the reversible thermoelectric circuit represented by FIG. 9C. The result of the second reversible process as shown establishes the equal Fermi level of all the pairs of electrodes for the reversible thermoelectric circuit represented by FIG. 9C. As a result of these two processes that, typically, can both be ultrafast, a time varying contact potential can be achieved for the reversible thermoelectric conversion circuit.

The physical basis of the reversible process which enables the electrical energy from the power conversion, heat pump, or refrigeration cycle, or combined cycles, to be transported between the first and second diodes over extreme distances, as in geothermal or space power conversion or over extreme temperature differences, as from incandescent to cryogenic temperatures, is that the use of reversible auxiliary components together with the use of the input voltage waveform required for the transportation of the electrical energy between the first and second diodes, enables the performance of the reversible thermoelectric conversion cycles of this invention to be achieved.

To achieve the required input waveforms, an AC electric field is used to apply a variable AC contact potential to the series array of pairs of electrodes for the first and second diodes as described above. For each diode, as shown in FIG. 14, auxiliary electrodes 270 and 272 connected to terminals 276 and 278, can be used to apply the AC contact potential by capacitance coupling to the first and last electrodes, 102 and 106, of the series array for both the first and second diodes. The required voltage level for the AC waveforms for the transportation of the conversion energy in each direction between the first and second diodes is obtained by the use of two voltage transformers.

The primary terminals of each step up transformer are connected to the terminals 116 and 118 of each series array as shown in FIG. 14. One of the secondary terminals of each step up transformer is connected to the connecting lead between the first and second diodes, and the other secondary terminal of each step up transformer is connected to the output lead of the reversible thermoelectric converter. The voltage level of the AC waveform for the electrical energy output from the first and second diodes is increased by the step up transformer up to the voltage level required for minimizing all transmission losses between the first and second diodes. For applications such as for the geothermal energy conversion at maximum depth and temperature, the use of transparent heat reservoir to enclose the first diode and connected step up transformer, such as described above using spaced layers of quartz material, can enable the equilibrium temperature inside the heat reservoir, for the crystal lattice of the first diode and the conducting wire of the connected step up transformer, to be minimized so that the reversible conversion processes of the first diode and the connected step transformer can be achieved without the use of coolant flow or added heat pump processes.

Similar increased separation distances for transporting thermal energy from the second diode to the first diode can be achieved by this reversible process for the heat pump or refrigeration cycles. To further increase this temperature range for the power conversion cycle, the thermal heat reservoirs for the second diode can be used to alternatively store and then remove the power conversion loss by using a heat pump cycle for the second diode during the AC cycle for which a DC component is added to the AC waveform for additional cooling of the second diode.

A basic option to achieve the required reversible performance from the voltage transformers for the power conversion cycle from a hot environment is the combined reversible cycle option shown in FIG. 13 with diodes 224 and 226 operating in a heat pump cycle to lower the temperature of diode 220 where the first diode 220 and the second diode 222 can operate in a power conversion cycle with diodes 222 and 226 being located in cool temperature reservoirs outside the hot environment. This combined cycle can maintain the temperature of the quasi-static heat reservoir 252 enclosing first diode 220 at the lower temperature required for reversible power conversion without any loss in the overall efficiency. For this option, the step up transformer is placed within the quasi-static heat reservoir 252 and with the temperature maintained as low as required to transform the voltage reversibly, using superconduction operation for the transformers if required. This example of an option for the control of the environment for auxiliary state-of-the-art components is an example of achieving a practical reversible process for many applications of the reversible thermoelectric converter.

Additional reversible auxiliary components that can be placed in the connecting leads between the first and second diode are capacitors. One application for the series connection of coupling capacitors to the connecting leads is to reduce the energy loss by thermal conduction through the conducting leads in regions of high thermal gradients such as in the high temperature region close to the first diode. For the refrigeration cycle approaching that for cryogenic temperatures, these regions can be close to the second diodes. The protection afforded by the capacitors against thermal loss for extreme temperature gradients can be used alone or together with the transformers in the connecting leads for high to low temperature applications involving superconducting materials.

One example of the combined use of capacitors to protect against thermal loss and transformers to protect against resistance loss is based on adding the use of the coupling capacitor to the above example of the combined reversible power conversion-heat pump cycle shown in FIG. 13. For this example, the coupling capacitor is placed in the thermal insulating wall of the heat reservoir, the outside capacitor terminal is connected through the conducting lead to the second diode and the inside capacitor terminal is connected to the high voltage output terminal of the step up voltage transformer. The combined two stage reversible thermoelectric converter uses the reversible step up transformer to minimize the electrical power loss in transmitting electrical power between the first and second diodes and uses the reversible coupling capacitor to minimize the thermal power loss in transmitting electrical power between the inside and the outside of the thermal insulating wall of the cold heat reservoir inside the furnace. This reversible performance can be obtained for the maximum power output that is generated inside the highest temperature furnace and that is transmitted for reversible power conversion to the cold second diode over the separation distance between the first and second diodes. This performance can be achieved using state-of-the-art auxiliary components by controlling the environment inside the heat reservoirs enclosing the auxiliary components.

Therefore, since the transformer and capacitors are reversible components in this controlled environment, these components, as well as other reversible components or combinations of reversible components in a controlled environment, can be used in circuits connected to the reversible thermoelectric converter of this invention, while accomplishing the reversible processes inherent to the reversible thermoelectric processes of this invention.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A reversible thermoelectric converter array comprising:
   a substrate;
   a plurality of spaced-apart first electrodes formed on said substrate;
   a dielectric film formed on said first electrodes;
   spaced-apart second electrodes formed on said dielectric film and spaced from said first electrodes by said dielectric film, each of said second electrodes at least partially overlapping a pair of said first electrodes such that each pair of said first electrodes, the partially overlapping second electrode and the dielectric film form a reversible thermoelectric converter array element, said reversible thermoelectric converter array elements being electrically connected in series, each of reversible thermoelectric converter array elements defining first and second diodes electrically connected together without a thermal barrier between them such that electric voltage fluctuations generated by said first diode are coupled to said second diode when the electrons in said first diode have a higher temperature than the electrons in said second diode, said first and second electrodes each having a thickness selected to insure that electric carriers are quantized in discrete energy levels.

2. A reversible thermoelectric converter array as defined in claim 1 wherein said first electrodes each comprise a thin aluminum film, said second electrodes each comprise a thin copper film and said dielectric film comprises a thin aluminum oxide film.

3. A reversible thermoelectric converter array as defined in claim 1 wherein said first electrodes each comprise a thin copper film, said second electrodes each comprise a thin copper film and said dielectric film comprises a thin aluminum oxide film.

4. A reversible thermoelectric converter array as defined in claim 1 further including a first transparent auxiliary electrode overlying and electrically insulated from said first and second electrodes, a second auxiliary electrode underlying and electrically insulated from said first and second electrodes and means for applying a voltage between said first and second auxiliary electrodes.

5. A reversible thermoelectric converter array as defined in claim 1 further including a first transparent auxiliary electrode overlying and electrically insulated from said first and second electrodes, a second auxiliary electrode underlying and electrically insulated from said first and second electrodes and means for applying a voltage between said first and second auxiliary electrodes, wherein a layer overlying said first auxiliary electrode provides means for concentrating incoming thermal energy on said first pairs of electrodes.

6. A reversible thermoelectric converter array as defined in claim 1, wherein said first electrodes each comprise a thin metal film, wherein said second electrodes each comprise a thin metal film and wherein work functions for said first and second electrodes are equal.

7. A reversible thermoelectric converter array as defined in claim 1, wherein said first electrodes and said second electrodes are each comprised of thin film quantum size effects of quantum boxes in a one-dimensional potential well formed by the thickness dimension of the crystal lattice of each of said first electrodes and each of said second electrodes.

8. A reversible thermoelectric converter array as defined in claim 1 wherein said first electrode comprises a thin metal film made up of quantum boxes forming one dimensional potential wells caused by the quantum size effects given by the thickness of the thin metal film comprising said first electrode and wherein said second electrodes comprise a thin semiconductor film forming one dimensional potential wells given by the thickness of the thin semiconductor film.

9. A reversible thermoelectric converter array comprising:
a substrate;
a plurality of spaced-apart first electrodes formed on said substrate;
a dielectric film formed on said first electrodes;
spaced-apart second electrodes formed on said dielectric film and spaced from said first electrodes by said dielectric film, each of said second electrodes at least partially overlapping a pair of said first electrodes such that each pair of said first electrodes, the partially overlapping second electrode and the dielectric film form a reversible thermoelectric converter array element, a first plurality of said reversible thermoelectric converter array elements defining a first diode and a second plurality of said reversible thermoelectric converter array elements defining a second diode, the array elements of said first diode being electrically connected in series with the same polarity and the array elements of said second well diode being electrically connected in series with the same polarity, said first and second diodes being electrically connected together without a thermal barrier between them such that electric voltage fluctuations generated by said first diode are coupled to said second diode when the electrons in the array elements of said first diode have a higher temperature than the electrons in the array elements of said second diode, said first and second electrodes each having a thickness selected to insure that electric carriers are quantized in discrete energy levels.

10. A reversible thermoelectric converter array as defined in claim 9 further including means for adding increments of voltage to the contact potential of each of said array elements, wherein said added increments of voltage to the contact potential are added in series with a positive polarity for each of said array elements of said first diode, wherein said added increments of voltage to the contact potential are added in series with a negative polarity for each of said array elements of said second diode, wherein the magnitude of the sum of said added increments of voltage to the contact potential of each of said array elements of said first diode is equal to the magnitude of the sum of said added increments of voltage to the contact potential of each of said array elements of said second diode.

11. A reversible thermoelectric converter array as defined in claim 10 wherein said means for adding increments of voltage comprises auxiliary electrodes underlying or overlying said first and second electrodes for said first diode and comprises auxiliary electrodes underlying or overlying first and second electrodes for said second diode and means for applying voltages to said auxiliary electrodes.

12. A reversible thermoelectric converter as defined in claim 10 wherein said first and second diodes are spaced apart and wherein the electrical energy generated by each of said array elements in said first diode during a power conversion cycle and in said spaced apart second diode during a heat pump cycle is transported by conducting leads over the physical separation distance between said first diode and said spaced apart second diode wherein the voltage to current ratio for the electrical energy being transported by said conducting leads over the physical separation distance between said first diode and said spaced apart second diode, is increased by a step up voltage transformer between said first diode and said conducting leads and by a step up voltage transformer between said spaced apart second diode and said conducting leads wherein the voltage to current ratio for the electrical energy transported by said conducting leads is increased to enable efficient transmission of the electrical energy generated by said first diode during the power conversion cycle and in said spaced apart second diode during the heat pump cycle to be transported by said conducting leads over the physical separation distance between said first diode and said spaced apart second diode.

13. A reversible thermoelectric converter array as defined in claim 10 further including means for mounting the first diode on the roof of a home, wherein said second diode is located in or out of the home as required for efficient transfer of thermal heat in or out of the home during the power conversion cycle.

14. A reversible thermoelectric converter array as defined in claim 13 further including means for converting the array to operate either in a heat pump or air condition cycle or in a power conversion cycle.

15. A reversible thermoelectric converter array as defined in claim 10 further including means for supporting the array in space.

16. A reversible thermoelectric converter array as defined in claim 10 further including means for supporting the array in a furnace.

17. A reversible thermoelectric converter array as defined in claim 13 further including means for converting the first diode mounted on the roof and said second diode located in or out of the home to operate either in a heat pump or air condition cycle or in a power conversion cycle with an AC or DC current.

18. A reversible thermoelectric converter array as defined in claim 10 further including means for supporting said array mounted on a thin film substrate deployed in space, wherein said array is able to reversibly operate in each of the reversible energy conversion cycles comprised of power conversion, refrigeration and amplification, whereby all energy conversion processes required for space station missions for the receiving and transmission of any amount of energy or information are achievable by electrical connections between a required number of said arrays, whereby an upper limit to the intrinsic efficiency of the thermoelectric cycle for both the power conversion of the solar energy and for the radiation of the energy loss from the area of each of said arrays is given by the maximum efficiency for reversible cycles and the lower limit of energy level of the information received and amplified is the energy level of the noise power for the cryogenic temperature of space as is achievable by refrigeration cycles, whereby the thermodynamic limits of the energy conversion processes for the space station can approach the same limit as exists for each of said arrays, whereby the cost of achieving practical models approaching a significant fraction of intrinsic efficiencies is minimized by the ultra light weight of components of said arrays.

19. A reversible thermoelectric converter array as defined in claim 16 wherein means are provided for supporting the first diode for each temperature environment up to a furnace environment, wherein an enclosure for the array for said first diode functions as thermal barrier as needed for protection of said first diode from unusable incoming heat to said enclosure, wherein materials of a supporting frame, conducting leads and electrodes inside the enclosure are radiation and heat resistant materials as needed, wherein a light trapping top layer, which is overlying said second electrodes, and a light reflecting and trapping back layer, which is underlying said first electrodes of said first diode, are provided for the trapping and absorption of all incoming thermal radiation energy from a heat source or from solar energy, wherein said light trapping top layer is provided as a transparent cover glass or a layered surface by means of textured surfaces or an anti-reflecting layer that are overlying said second electrodes of said first diodes, wherein said light reflecting and trapping back layer is provided by conducting reflecting metal films on spaced-apart auxiliary electrodes underlying said first electrodes of said first diode, wherein all incoming thermal energy is trapped and converted into electric energy inside the enclosure for said first diode, wherein a number of said pairs of electrodes in said first diode is increased so as to increase the voltage to current ratio for the current as required to minimize any thermal energy loss resulting from thermal conduction from the temperature of the hot electrons in said first diode out of said enclosure to the temperature of the cold electrons in the second diode, wherein maximum power conversion efficiency is obtained, given by the ratio of the temperature of the hot electrons in the first diode at the temperature of the heat source or of solar energy to the temperature of the cool electrons in the second diode at the temperature of the cool environment of the second electrode.

20. A reversible thermoelectric converter array as defined in claim 10 further comprising means for supplying to said array a voltage sufficient to reverse polarity of said array, thereby reversing the direction of the current and thereby reversing the thermoelectric cycle for said reversible thermoelectric converter array from a cycle for power conversion to reverse cycles of heat pump, refrigeration or air conditioning, wherein said second diode receives thermal energy from an external source and converts the thermal energy into electric voltage fluctuations and said first diode converting the electric voltage fluctuations to thermal energy at a higher temperature than the temperature of the external source, whereby thermal energy from an external source is converted to thermal energy at a higher temperature than the external source and whereby the reversible thermodynamic conversion can operate with a DC or AC output and can operate with the distance between said first and second diodes spaced-apart as required.

21. A reversible thermoelectric converter array as defined in claim 9, wherein one or more first and second electrodes are added adjacent to each of said first and second electrodes in the series array of the first diode, wherein each of said added electrodes is overlying each of said first and said second electrodes and/or underlying each of said first and said second electrodes, wherein each added series array of each of said added first and second electrodes is spaced apart by a dielectric layer from each adjacent series array of said first and second electrodes to provide additional trapping length for incoming thermal energy, wherein a required increment of contact potential is added to each of said added first and second electrodes, wherein each separate added series array of first and second electrodes is connected in parallel electrically to add to the power output of the series array for the first diode, wherein each of said added first and second electrodes has the selected thickness and the required separate increment of contact potential to provide the required absorption and conversion band for a given thermal energy band in the temperature spectrum of the incoming thermal energy, wherein the maximum efficiency of power conversion of the given total temperature spectrum of the incoming thermal energy to the first diode is achieved.

* * * * *